United States Patent
Takaya et al.

(10) Patent No.: US 12,068,750 B2
(45) Date of Patent: Aug. 20, 2024

(54) ELECTRONIC CIRCUITRY AND POWER CONVERTER

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Satoshi Takaya, Kawasaki Kanagawa (JP); Hiroaki Ishihara, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 18/180,582

(22) Filed: Mar. 8, 2023

(65) Prior Publication Data
US 2024/0088880 A1 Mar. 14, 2024

(30) Foreign Application Priority Data
Sep. 8, 2022 (JP) ................. 2022-143229

(51) Int. Cl.
H03K 5/135 (2006.01)
H03K 5/00 (2006.01)
(52) U.S. Cl.
CPC ......... H03K 5/135 (2013.01); H03K 5/00006 (2013.01); H03K 2005/00286 (2013.01)

(58) Field of Classification Search
None
See application file for complete search history.

(56) References Cited

U.S. PATENT DOCUMENTS

| | | | |
|---|---|---|---|
| 8,378,663 B2 | 2/2013 | Cadoux et al. | |
| 8,390,270 B2 | 3/2013 | Cadoux et al. | |
| 10,996,178 B2 | 5/2021 | Dandy et al. | |
| 11,101,779 B2 | 8/2021 | Togawa | |
| 11,152,928 B2 | 10/2021 | Takaya et al. | |

(Continued)

FOREIGN PATENT DOCUMENTS

| | | |
|---|---|---|
| JP | 2019-011989 A | 1/2019 |
| JP | 2019-039904 A | 3/2019 |

(Continued)

*Primary Examiner* — Cassandra F Cox
(74) *Attorney, Agent, or Firm* — Foley & Lardner LLP

(57) ABSTRACT

According to one embodiment, an electronic circuitry includes a clock generation circuit configured to generate a first clock signal; a first conversion circuit configured to convert an input signal into a first signal having a frequency corresponding to the first clock signal based on the first clock signal; a first electromagnetic field coupler configured to transmit the first signal by electromagnetic field coupling; a second electromagnetic field coupler configured to transmit the first clock signal by electromagnetic field coupling; and a second conversion circuit configured to convert the first signal transmitted by the first electromagnetic field coupler into a second signal having a frequency corresponding to the input signal, based on the first clock signal transmitted by the second electromagnetic field coupler.

20 Claims, 15 Drawing Sheets

(56) References Cited

U.S. PATENT DOCUMENTS

| | | | |
|---|---|---|---|
| 11,303,266 B2* | 4/2022 | Ishihara | H03K 5/00006 |
| 11,437,961 B2 | 9/2022 | Hancioglu et al. | |
| 11,855,617 B2* | 12/2023 | Takaya | H03F 1/52 |
| 2020/0367776 A1 | 11/2020 | Matsumoto | |
| 2022/0004218 A1 | 1/2022 | Takaya et al. | |
| 2022/0091163 A1 | 3/2022 | Majima | |
| 2022/0094319 A1 | 3/2022 | Majima | |
| 2022/0302880 A1 | 9/2022 | Takahashi et al. | |

FOREIGN PATENT DOCUMENTS

| | | |
|---|---|---|
| JP | 2019-110385 A | 7/2019 |
| JP | 2019-114901 A | 7/2019 |
| JP | 6592761 B1 | 10/2019 |
| JP | 2020-010137 A | 1/2020 |
| JP | 2020-118492 A | 8/2020 |
| JP | 2020-145545 A | 9/2020 |
| JP | 2020-148719 A | 9/2020 |
| JP | 2020-156025 A | 9/2020 |
| JP | 2020-159738 A | 10/2020 |
| JP | 6796778 B2 | 12/2020 |
| JP | 6823878 B2 | 2/2021 |
| JP | 2021-042996 A | 3/2021 |
| JP | 2021-089149 A | 6/2021 |
| JP | 2021-093682 A | 6/2021 |
| JP | 2021-093683 A | 6/2021 |
| JP | 6920114 B2 | 8/2021 |
| JP | 2021-139796 A | 9/2021 |
| JP | 6958617 B2 | 11/2021 |
| JP | 2022-008258 A | 1/2022 |
| JP | 2022-022716 A | 2/2022 |
| JP | 2022-041655 A | 3/2022 |
| JP | 2022-052838 A | 4/2022 |
| JP | 2022-052839 A | 4/2022 |
| WO | WO-2019/008627 A1 | 1/2019 |
| WO | WO-2019/008628 A1 | 1/2019 |
| WO | WO-2019/163374 A1 | 8/2019 |
| WO | WO-2020/213082 A1 | 10/2020 |
| WO | WO-2021/038390 A1 | 3/2021 |
| WO | WO-2021/261193 A1 | 12/2021 |

\* cited by examiner

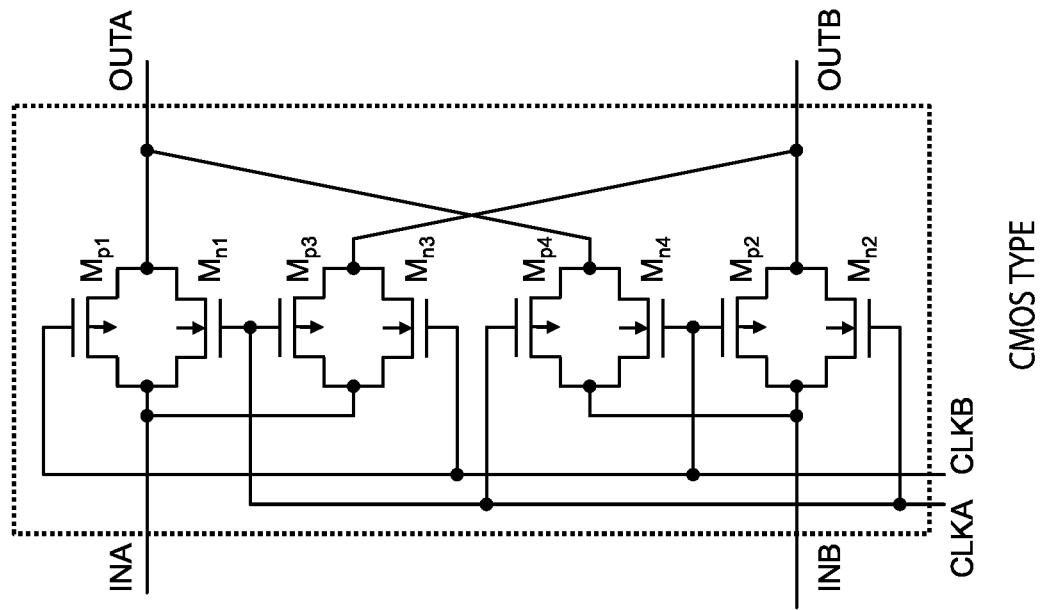
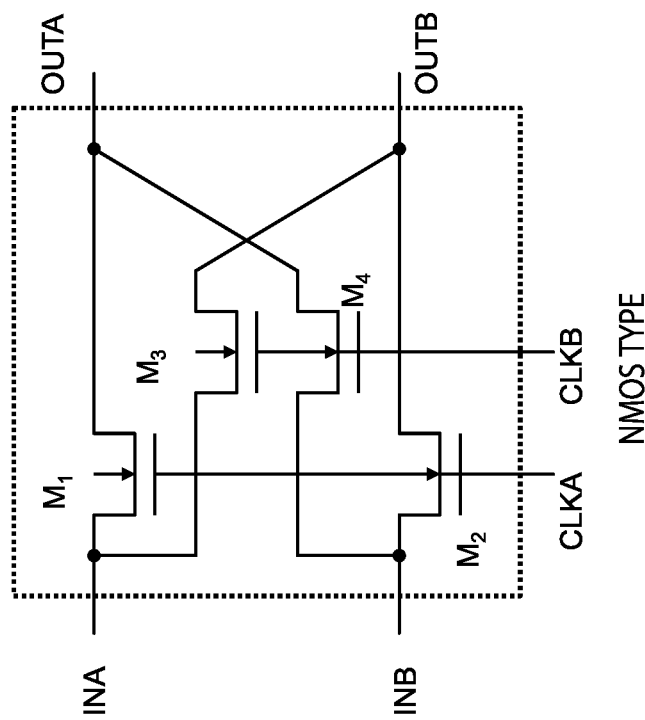
FIG. 4A
FIG. 4B

ELECTRONIC CIRCUITRY AND POWER CONVERTER

CROSS REFERENCE TO RELATED APPLICATIONS

This application is based upon and claims the benefit of priority from the prior Japanese Patent Application No. 2022-143229, filed on Sep. 8, 2022, the entire contents of which are incorporated herein by reference.

FIELD

Embodiments described herein relate to an electronic circuitry and a power converter.

BACKGROUND

Electronic circuitries that transmit analog signals from an input side to an output side through insulation have been developed. As an example of this kind of electronic circuitry, there is a known technique in which analog signals are once converted into high-frequency signals, transmitted through insulation by electromagnetic field coupling, and restored to the original analog signals. In electronic circuitries proposed so far, there are concerns that an input range becomes narrow, SN ratios of restored signals are lowered, and the like. Further, there is a concern that the performance of an entire system will be limited by the input range.

BRIEF DESCRIPTION OF THE DRAWINGS

FIGS. 4A and 4B are diagrams each illustrating a configuration example of a frequency converter;

DETAILED DESCRIPTION

According to one embodiment, an electronic circuitry includes a clock generation circuit configured to generate a first clock signal; a first conversion circuit configured to convert an input signal into a first signal having a frequency corresponding to the first clock signal based on the first clock signal; a first electromagnetic field coupler configured to transmit the first signal by electromagnetic field coupling; a second electromagnetic field coupler configured to transmit the first clock signal by electromagnetic field coupling; and a second conversion circuit configured to convert the first signal transmitted by the first electromagnetic field coupler into a second signal having a frequency corresponding to the input signal, based on the first clock signal transmitted by the second electromagnetic field coupler.

Hereinafter, embodiments of the present invention will be described with reference to the drawings.

First Embodiment

Figure 1:
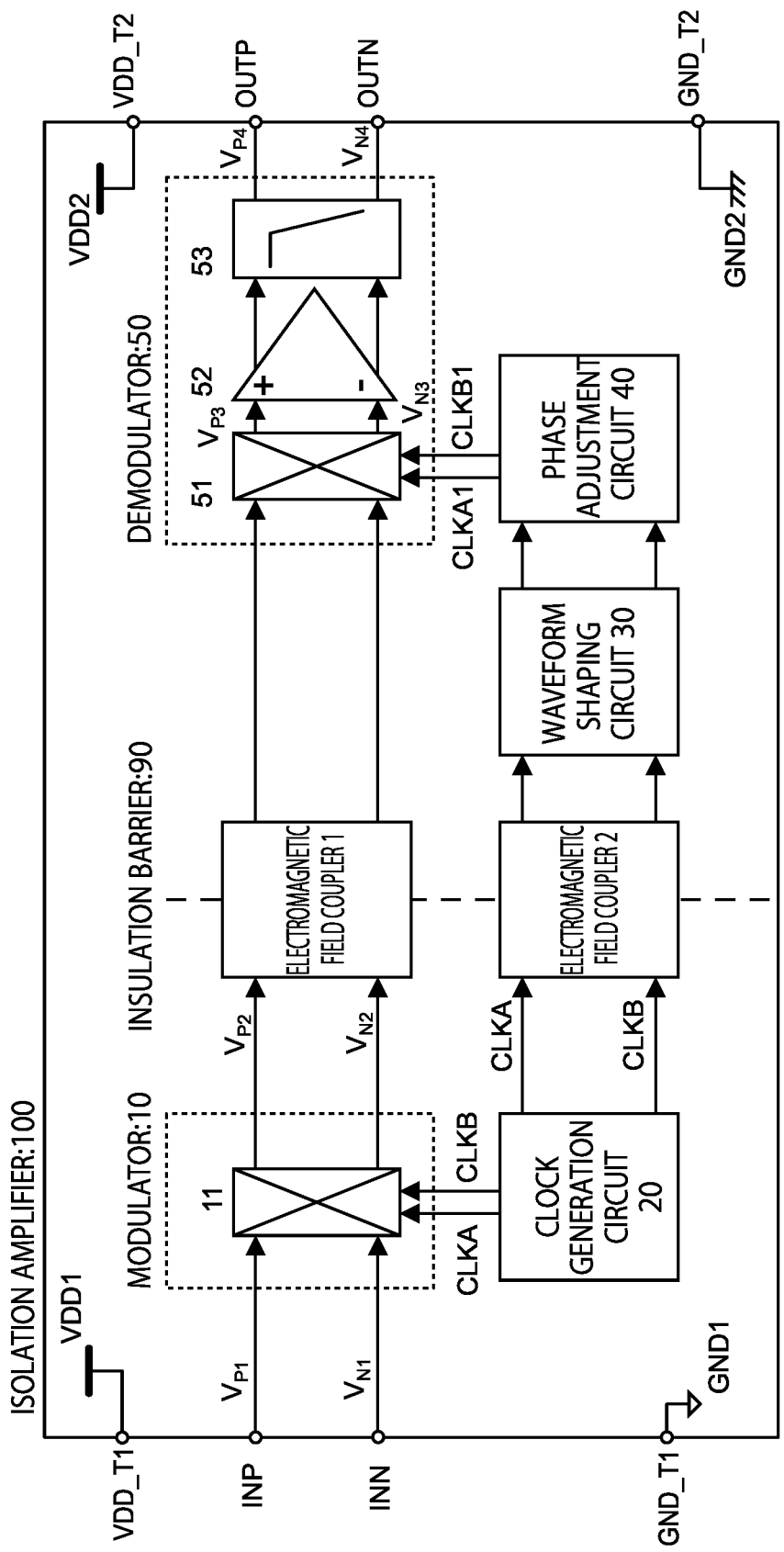
FIG. 1 is a diagram illustrating a configuration example of an isolation amplifier, as an electronic circuitry according to a first embodiment.

FIG. 1 illustrates a configuration example of an isolation amplifier 100, as an electronic circuitry according to a first embodiment. The isolation amplifier 100 is a circuit that transmits an analog signal, which is an input signal supplied to an input side, to an output side through insulation. In the following description, with an insulation barrier 90 (isolation barrier) as a boundary, an analog signal input side (left side in the drawing) is referred to as a primary side and an analog signal output side (right side in the drawing) is referred to as a secondary side.

On the primary side and the secondary side, independent reference potentials GND1 and GND2 and independent power sources VDD1 and VDD2 are used, respectively. As an example, the primary side (left side in the drawing) is a high-voltage side and the secondary side (right side in the drawing) is a low-voltage side. On the primary side and the secondary side, terminals GND_T1 and GND_T2, to which the reference potentials GND1 and GND2 are supplied respectively, are provided. Further, on the primary side and the secondary side, terminals VDD_T1 and VDD_T2 to which power source potentials are supplied from the power sources VDD1 and VDD2 are provided, respectively.

On the primary side, an input terminal INP and an input terminal INN, to which analog signals to be transmitted to the secondary side are input, are provided. The input terminal INP and the input terminal INN are connected to, for example, one end and the other end of an element, respectively, which serves as a voltage or current measurement object. From the input terminals INP and INN, analog signals $V_{P1}$ and $V_{N1}$ indicating voltages at the one end and the other end are input. That is, the voltages of the one end and the other end of the object element are input between the input terminal INP and the input terminal INN.

Figure 2:
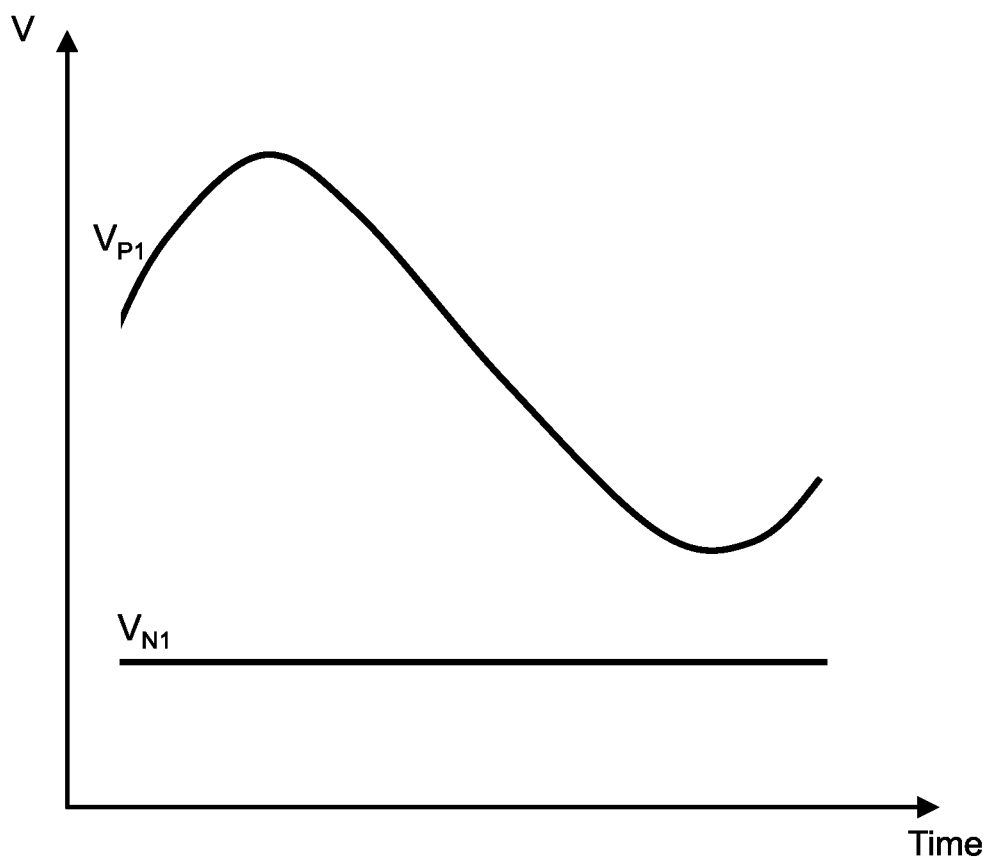
FIG. 2 is a diagram schematically illustrating analog signals that are input signals.

FIG. 2 schematically illustrates the analog signals $V_{P1}$ and $V_{N1}$ (input signals) input to the input terminal INP and the input terminal INN. The analog signals $V_{P1}$ and $V_{N1}$ are input signals of the isolation amplifier 100. The difference between the analog signals $V_{P1}$ and $V_{N1}$ (input signal amplitude) represents the voltage of the element to be measured. In this example, the input terminal INN is connected to the reference potential, but the portion where the input terminal INN is connected is not limited to the reference potential.

The element to be measured is, as an example, a transistor, a resistor, or the like. The analog signals to be input have, for example, arbitrary waveforms of several tens of Hz to several tens of MHz. The input analog signals are input to a modulator 10 (first conversion circuit). The modulator 10 is the first conversion circuit that increases frequencies of the signals to be input. The modulator 10 includes a frequency converter 11. The frequency converter 11 may also be called a mixer, a chopper, a sampling circuit, or the like.

A clock generation circuit 20 is provided on the primary side. The clock generation circuit 20 generates clock signals CLKA and CLKB being rectangular waves. The clock signals CLKA and CLKB correspond to a first clock signal generated by the clock generation circuit 20.

Figure 3:
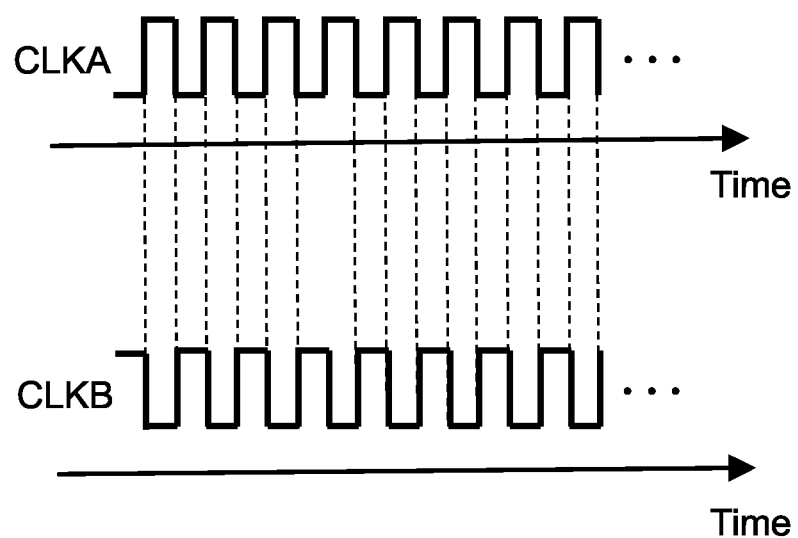
FIG. 3 is a diagram illustrating examples of two clock signals that are differential signals.

FIG. 3 illustrates examples of the clock signals CLKA and CLKB. The clock signals CLKA and CLKB are signals including periodic square pulses. The clock signals CLKA and CLKB are differential clock signals. That is, the clock signal CLKB is a signal obtained by inverting the clock signal CLKA. When the level of CLKA is high, the level of CLKB is low. When the level of CLKA is low, the level of CLKB is high. The clock signals CLKA and CLKB have the same period (frequency) that is, for example, several hundreds of MHz. The clock signals CLKA and CLKB have amplitudes that are the same or substantially the same.

The clock generation circuit 20 not only supplies the clock signals CLKA and CLKB to the modulator 10 but also transmits the clock signals CLKA and CLKB to the secondary side via an electromagnetic field coupler 2.

The frequency converter 11 in the modulator 10 increases frequencies of the analog signals $V_{P1}$ and $V_{N1}$ (input signals) to be input from the input terminals INP and INN, based on the clock signals CLKA and CLKB to be supplied from the clock generation circuit 20. That is, the frequency converter 11 converts the analog signals $V_{P1}$ and $V_{N1}$ according to periods (frequencies) of the clock signals CLKA and CLKB to generate high-frequency signals $V_{P2}$ and $V_{N2}$. The high-frequency signals $V_{P2}$ and $V_{N2}$ have frequencies corresponding to the clock signals CLKA and CLKB. In the present embodiment, increasing the frequencies of signals based on the clock signals is referred to as modulating the signals. The high-frequency signals $V_{P2}$ and $V_{N2}$ are output to an electromagnetic field coupler 1. The high-frequency signals $V_{P2}$ and $V_{N2}$ correspond to a first signal to be generated by converting the frequency of an input signal. The first signal has a frequency corresponding to the first clock signal.

FIG. 4 illustrates two configuration examples of the frequency converter 11 in the modulator 10. In each configuration, the high-frequency signals $V_{P2}$ and $V_{N2}$ are generated by sampling (modulating) the analog signals $V_{P1}$ and $V_{N1}$, which are input signals to be input between a terminal INA and a terminal INB, in mutually opposite directions according to the clock signals CLKA and CLKB. Of the generated high-frequency signals $V_{P2}$ and $V_{N2}$, the high-frequency signal $V_{P2}$ is output from a terminal OUTA, and the high-frequency signal $V_{N2}$ is output from a terminal OUTB.

FIG. 4A illustrates the configuration example of the frequency converter 11 that uses NMOS transistors. When the level of clock signal CLKA is high and the level of clock signal CLKB is low, NMOS transistors $M_1$ and $M_2$ are turned on and NMOS transistors $M_3$ and $M_4$ are turned off. Then, signals in phase with the input signals are output from terminals OUTA and OUTB of the frequency converter 11. That is, the sampled signal of the input signal $V_{P1}$ is output from the terminal OUTA of the frequency converter 11, and the sampled signal of the input signal $V_{N1}$ is output from the terminal OUTB of the frequency converter 11. When the level of clock signal CLKA is low and the level of clock signal CLKB is high, the NMOS transistors $M_1$ and $M_2$ are turned off and the NMOS transistors $M_3$ and $M_4$ are turned on. Then, signals in opposite phase with the input signals are output from the terminals OUTA and OUTB of the frequency converter 11. That is, the sampled signal of the input signal $V_{P1}$ is output from the terminal OUTB of the frequency converter 11, and the sampled signal of the input signal $V_{N1}$ is output from the terminal OUTA of the frequency converter 11. As described above, the high-frequency signal $V_{P2}$ to be output from the terminal OUTA is generated, and the high-frequency signal $V_{N2}$ to be output from the terminal OUTB is generated.

FIG. 4B illustrates the configuration example of the frequency converter 11 that uses NMOS transistors and PMOS transistors. When the level of clock signal CLKA is high and the level of clock signal CLKB is low, an NMOS transistor $M_{n1}$, a PMOS transistor $M_{p1}$, an NMOS transistor $M_{n2}$, and a PMOS transistor $M_{p2}$ are turned on, and an NMOS transistor $M_{n3}$, a PMOS transistor $M_{p3}$, an NMOS transistor $M_{n4}$, and a PMOS transistor $M_{p4}$ are turned off. As a result, signals in phase with the input signals are output from the terminals OUTA and OUTB of the frequency converter 11. When the level of clock signal CLKA is low and the level of clock signal CLKB is high, the NMOS transistor $M_{n1}$, the PMOS transistor $M_{p1}$, the NMOS transistor $M_{n2}$, and the PMOS transistor $M_{p2}$ are turned off, and the NMOS transistor $M_{n3}$, the PMOS transistor $M_{p3}$, the NMOS transistor $M_{n4}$, and the PMOS transistor $M_{p4}$ are turned on. As a result, signals in opposite phase with the input signals are output from the terminals OUTA and OUTB of the frequency converter 11.

Figure 5:
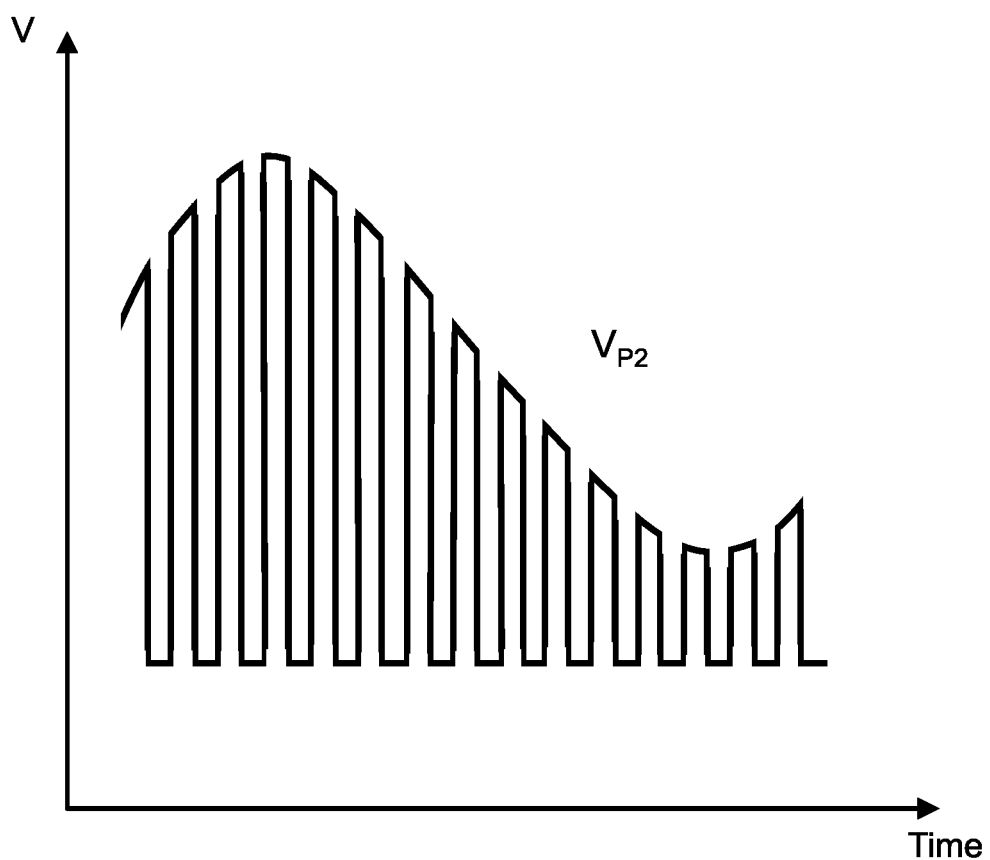
FIG. 5 is a diagram illustrating an example of a high-frequency signal.

FIG. 5 illustrates an example of the high-frequency signal $V_{P2}$ to be output from the terminal OUTA. The high-frequency signal $V_{P2}$ is generated when the input signals $V_{P1}$ and $V_{N1}$ are mutually sampled according to the clock signals CLKA and CLKB. Similarly, the high-frequency signal $V_{N2}$ is generated when the input signals $V_{N1}$ and $V_{P1}$ are mutually sampled according to the clock signals CLKA and CLKB.

The electromagnetic field coupler 1 is a transmitter that insulates between the primary side and the secondary side and transmits the high-frequency signals $V_{P2}$ and $V_{N2}$ to be input from the modulator 10 to the secondary side through insulation. The electromagnetic field coupler 1 includes, for example, capacitors or transformers. The electromagnetic field coupler 1 has characteristics that cause rotation (fluctuation) of phase with respect to the signal to be input to the electromagnetic field coupler 1 in the transmission of the high-frequency signals from the primary side to the secondary side.

FIG. 6 illustrates four configuration examples of the electromagnetic field coupler 1.

Figure 6A:
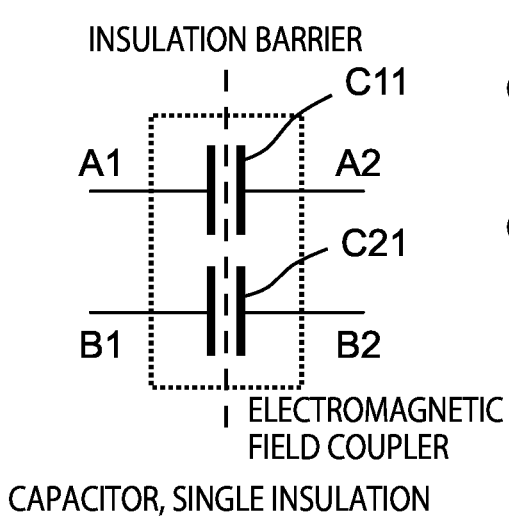
FIGS. 6A to 6D are diagrams each illustrating a configuration example of an electromagnetic field coupler.

FIG. 6A illustrates a configuration example of the electromagnetic field coupler 1 that uses capacitors. The electromagnetic field coupler 1 includes two terminals A1 and B1 on the input side, and two terminals A2 and B2 on the output side. The high-frequency signal $V_{P2}$ is input to the terminal A1, and the high-frequency signal $V_{N2}$ is input to the terminal B1. A single capacitor C11 is provided between the terminal A1 and the terminal A2, and the high-frequency signal $V_{P2}$ to be input to the terminal A1 is transmitted, via the capacitor C11, to the terminal B1 on the output side. A single capacitor C21 is provided between the terminal B1 and the terminal B2, and the high-frequency signal $V_{N2}$ to be input to the terminal B1 is transmitted, via the capacitor C21, to the terminal B2 of the output side. The capacitors C11 and C21 function as insulation barriers that insulate between the input side and the output side. More specifically, a dielectric portion (insulator), such as a silicon oxide film or a polyimide film, between two mutually opposing flat plates of the capacitor functions as an insulation barrier. The configuration of FIG. 6A can reduce the area of the electromagnetic field coupler, compared to the configuration of an electromagnetic field coupler using transformers described below. As an example, the capacitors C11 and C21 have the same capacitance, although they may be configured to be mutually different in capacitance.

Figure 6B:
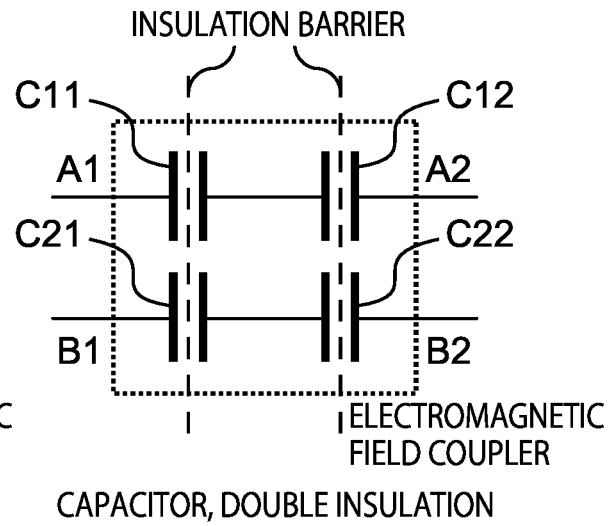

FIG. 6B illustrates a configuration example of the electromagnetic field coupler 1 that uses multiple-type capacitors. The configuration of FIG. 6B is obtained by replacing each of the capacitors C11 and C21 of FIG. 6A with a plurality of serially connected capacitors. A plurality of capacitors C11 and C12 connected in series is provided between terminals A1 and A2, and a plurality of capacitors C21 and C22 connected in series is provided between terminals B1 and B2. The capacitors C11, C12, C21, and C22 function as insulation barriers that insulate between the input side and the output side. In the case of the single capacitor configuration in FIG. 6A, when the capacitor breaks down, there will be a possibility that the primary side and the secondary side will be electrically conducted with each other. However, connecting multiple capacitors in series can hold the insulation even when one of the plurality of capacitors breaks down. This makes it possible to improve the safety. As an example, the capacitors C11 and C21 have the same capacitance, but they may be configured to be mutually different in capacitance. As an example, the capacitors C12 and C22 have the same capacitance, but they may be configured to be mutually different in capacitance.

Figure 6C:
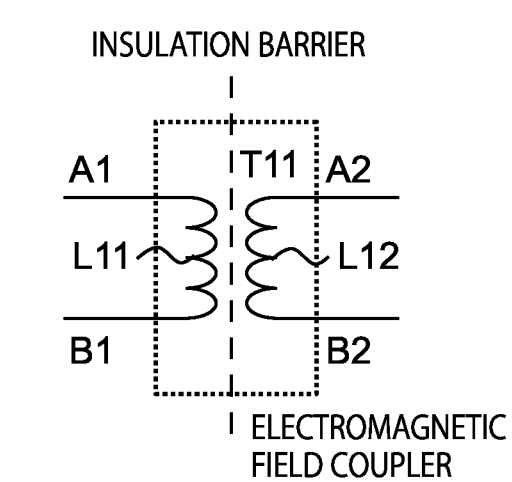

FIG. 6C illustrates a configuration example of the electromagnetic field coupler 1 that uses transformers. A coil L11 is connected between terminals A1 and B1 on the input side, and a coil L12 is connected between terminals A2 and B2 on the output side. The coil L11 and the coil L12 face each other to form a single transformer T11. The transformer T11 functions as an insulation barrier that insulates between the input side and the output side. More specifically, a dielectric portion, such as an air layer, a silicon oxide film, or a polyimide film, between the coil L11 and the coil L12 functions as the insulation barrier. Compared to the electromagnetic field coupler using the capacitors illustrated in FIG. 6A or FIG. 6B, it is possible to improve common mode characteristics, such as CMRR or CMTI.

Figure 6D:
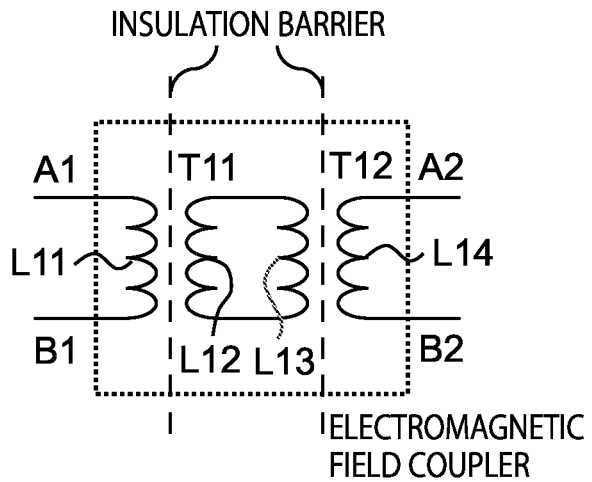

FIG. 6D illustrates a configuration example of the electromagnetic field coupler 1 that uses multiple-type transformers. A coil L11 is connected between terminals A1 and B1 on the input side, and the coil L11 faces a coil L12 to form a transformer T11. In addition, a coil L13 having both ends connected to both ends of the coil L12 is provided. The coil L13 faces a coil L14 connected between terminals A2 and B2 on the output side to form a transformer T12. As a result, the transformers T11 and T12 are multiply connected. The transformers T11 and T12 function as insulation barriers including the boundary that insulates between the input side and the output side. In the case of the single transformer configuration in FIG. 6C, when the transformer breaks down, there will be a possibility that the primary side and the secondary side will be electrically conducted with each other. However, connecting multiple transformers can hold the insulation even when one of the plurality of transformers breaks down. This makes it possible to improve the safety.

The electromagnetic field coupler 2 is a transmitter that insulates between the primary side and the secondary side and transmits the clock signals input from the clock generation circuit 20, through insulation, to the secondary side. The electromagnetic field coupler 2 includes, for example, capacitors or transformers. The electromagnetic field coupler 2 has characteristics that cause rotation of phase with respect to the signal to be input to the electromagnetic field coupler 2 in the transmission of the clock signals from the primary side to the secondary side. The electromagnetic field coupler 2 is similar, in configuration example, to those of FIGS. 6A to 6D. In the configurations illustrated in FIGS. 6A to 6D, the clock signals CLKA and CLKB are input to the terminals A1 and B1, respectively, and the input clock signals CLKA and CLKB are transmitted, through insulation, and output from the terminals A2 and B2.

In the present embodiment, the configuration of the electromagnetic field coupler 2 is assumed to be the same as that of the electromagnetic field coupler 1. This makes it possible to equalize or substantially equalize the phase rotation amount (phase delay amount) generated in the respective electromagnetic field couplers 1 and 2. However, it is not excluded that the electromagnetic field couplers 1 and 2 have different configurations. The electromagnetic field couplers 1 and 2 may have different configurations, and the phase rotation amount (phase delay amount) generated in the electromagnetic field couplers 1 and 2 may be the same or substantially the same. Further, it is also possible for the phase rotation amount generated in the electromagnetic field couplers 1 and 2 to be different.

A waveform shaping circuit 30 shapes the clock signals CLKA and CLKB transmitted via the electromagnetic field coupler 2. The amplitude of the clock signal received on the secondary side via the electromagnetic field coupler 2 fluctuates (for example, attenuates) due to characteristics of the electromagnetic field coupler 2. The waveform shaping circuit 30 adjusts (shapes) the amplitude of the clock signal transmitted via the electromagnetic field coupler 2, according to the amplitude of the clock signal used on the secondary side. For example, the amplitude of the clock signal received on the secondary side is amplified so that it has the same amplitude as that of the clock signals CLKA and CLKB generated by the clock generation circuit 20. In this case, the waveform shaping circuit 30 includes an amplifier that amplifies the amplitude of the clock signal received on the secondary side. Alternatively, when the amplitude of the clock signal used on the secondary side is small, the waveform shaping circuit 30 may be a circuit that clips the amplitude of the clock signal received on the secondary side. Alternatively, as other examples, in the case of the configuration using the transformers in the electromagnetic field coupler 2, a configuration in which the voltage of the signal to be transmitted increases during transmission is also conceivable. In this case, it is also possible to clip the voltage of a transmitted signal so that it has the same amplitude as that of the clock signals CLKA and CLKB generated by the clock generation circuit 20.

A phase adjustment circuit 40 adjusts the phases of the clock signals CLKA and CLKB shaped by the waveform shaping circuit 30. The phase adjustment circuit 40 is configured, for example, by a delay circuit. When the waveforms of the clock signals CLKA and CLKB are shaped by the waveform shaping circuit 30, phase delays in the clock signals CLKA and CLKB occur. Therefore, during waveform shaping, the phases of the clock signals CLKA and CLKB are delayed with respect to the high-frequency signals $V_{P2}$ and $V_{N2}$ to be transmitted via the electromagnetic field coupler 1. The phase adjustment circuit 40 adjusts (compensates) the phases of the clock signals CLKA and CLKB by these delays, so that the phases of the clock signals CLKA and CLKB are matched with those of the high-frequency signals $V_{P2}$ and $V_{N2}$. Phase-adjusted clock signals CLKA1 and CLKB1 are input to a demodulator 50. The clock signals CLKA1 and CLKB1 whose phases are adjusted by the phase adjustment circuit 40 correspond to a second clock signal.

The demodulator 50 includes a frequency converter 51, an amplifier 52, and a low pass filter (LPF) 53. The demodulator 50 is a second conversion circuit that converts (reduces) the frequency of the high-frequency signal (the first signal) to be input to the demodulator 50 based on the phase-adjusted clock signal to be input from the phase adjustment circuit 40. As a result, the demodulator 50 generates an output signal (second signal) having a frequency corresponding to the input signal. In the present embodiment, reducing the frequency of the signal to be input based on the clock signal is referred to as demodulating the signal. The output signal corresponds to an analog signal obtainable when the high-frequency signal to be input in the demodulator 50 is restored to have a frequency comparable to that of the original input signal. The output signal is also referred to as a restoration signal. The demodulator 50 will be described in detail below.

The frequency converter 51 in the demodulator 50 converts (demodulates) the high-frequency signals $V_{P2}$ and $V_{N2}$ to be input via the electromagnetic field coupler 1 based on the phase-adjusted clock signals CLKA1 and CLKB1 to be input from the phase adjustment circuit 40. As a result, analog signals $V_{P3}$ and $V_{N3}$ having frequencies corresponding to the input signal are generated. For example, the analog signals $V_{P3}$ and $V_{N3}$ are generated by sampling the high-frequency signals $V_{P2}$ and $V_{N2}$ in mutually opposite directions based on the clock signal CLKA1 and CLKB1.

The analog signals $V_{P3}$ and $V_{N3}$ correspond to a fifth signal obtained by converting the frequency of the first signal (high-frequency signals $V_{P2}$ and $V_{N2}$) transmitted by the electromagnetic field coupler 1 based on the first clock signal transmitted by the electromagnetic field coupler 2. The fifth signal has a frequency corresponding to the input signal (analog signals $V_{P1}$ and $V_{N1}$).

Like the frequency converter 11, the configuration of FIG. 4A or FIG. 4B can be used as a configuration example of the frequency converter 51. In the configuration illustrated in FIG. 4A or FIG. 4B, the high-frequency signals $V_{P2}$ and $V_{N2}$ are input to the terminals INA and INB, respectively. And, instead of the clock signals CLKA and CLKB, the clock signals CLKA1 and CLKB1 are input. As a result, the analog signals $V_{P3}$ and $V_{N3}$ converted from the high-frequency signals $V_{P2}$ and $V_{N2}$ are output from the terminals OUTA and OUTB, respectively.

The amplifier 52 amplifies the analog signals $V_{P3}$ and $V_{N3}$ converted by the frequency converter 51 and outputs the amplified analog signals $V_{P3}$ and $V_{N3}$ to the low pass filter 53.

The low pass filter 53 attenuates or reduces high-frequency components (high-frequency components contained in the clock signals CLKA1 and CLKB1 and the high-frequency signals $V_{P2}$ and $V_{N2}$) from the amplified analog signals $V_{P3}$ and $V_{N3}$. As a result, analog signals $V_{P4}$ and $V_{N4}$ serving as the output signal (the second signal) are generated. The low pass filter 53 outputs the analog signals $V_{P4}$ and $V_{N4}$ from an output terminal OUTP and an output terminal OUTN.

The modulator 10, the clock generation circuit 20, the waveform shaping circuit 30, the phase adjustment circuit 40, and the demodulator 50 in FIG. 1 may be formed by circuits or processors such as an application specific integrated circuit (ASIC), and a field-programmable gate array (FPGA). Alternatively, some or all of these elements may be implemented by a CPU that executes programs.

As described above, according to the present embodiment, generating the clock signal on the primary side can modulate the input signal by the clock signal having the amplitude of the power source voltage. Therefore, the input range of the input signal can be widened.

Further, according to the present embodiment, making the electromagnetic field coupler 1 and the electromagnetic field coupler 2 the same in configuration can equalize or substantially equalize the phase rotation amount (phase delay amount) generated in the electromagnetic field coupler 1 with respect to the high-frequency signal to be output from the modulator 10 with the phase rotation amount generated in the electromagnetic field coupler 2 with respect to the clock signal. Therefore, the adjustment range of the phase of the clock signal to be supplied to the demodulator 50 can be narrowed.

Further, according to the present embodiment, performing demodulation using the phase-adjusted clock signal by the phase adjustment circuit 40 in the demodulator 50 on the secondary side can reduce the phase difference between the high-frequency signal to be input to the demodulator 50 and this phase-adjusted clock signal. Accordingly, the high-frequency signal can be demodulated with the maximum amplitude. This makes it possible to maximize the SN ratio of the analog signal restored by demodulation (i.e., the restoration signal).

Modified Example

The phase adjustment circuit 40 can be omitted when the phase delay corresponding to the phase adjustment amount that requires phase adjustment by the phase adjustment circuit 40 can be absorbed by the electromagnetic field coupler 2 and the waveform shaping circuit 30. In this case, the position delay in the electromagnetic field coupler 1 is the same or substantially the same with the phase delays in the electromagnetic field coupler 2 and the waveform shaping circuit 30. This makes it possible to eliminate the need for the phase adjustment circuit 40 and reduce the circuit scale. Additionally, the clock generation circuit 20 may be omitted and the clock signals CLKA and CLKB may be directly supplied from the outside of the isolation amplifier 100. The clock signals CLKA and CLKB may be generated by a multiplication circuit, a divider circuit, a phase locked loop (PLL), and the like, by using the clock signal supplied from the outside of the isolation amplifier 100 as a reference.

Second Embodiment

Although the phase of the clock signal to be input to the demodulator 50 is adjusted in the above-described first embodiment, the phase of the high-frequency signal to be input to the demodulator 50 is adjusted in a second embodiment. It is assumed that the electromagnetic field couplers 1 and 2 are the same in configuration. It is also assumed that the phase delay amount of the electromagnetic field coupler 1 and the phase delay amount of the electromagnetic field coupler 2 are the same.

Figure 7:
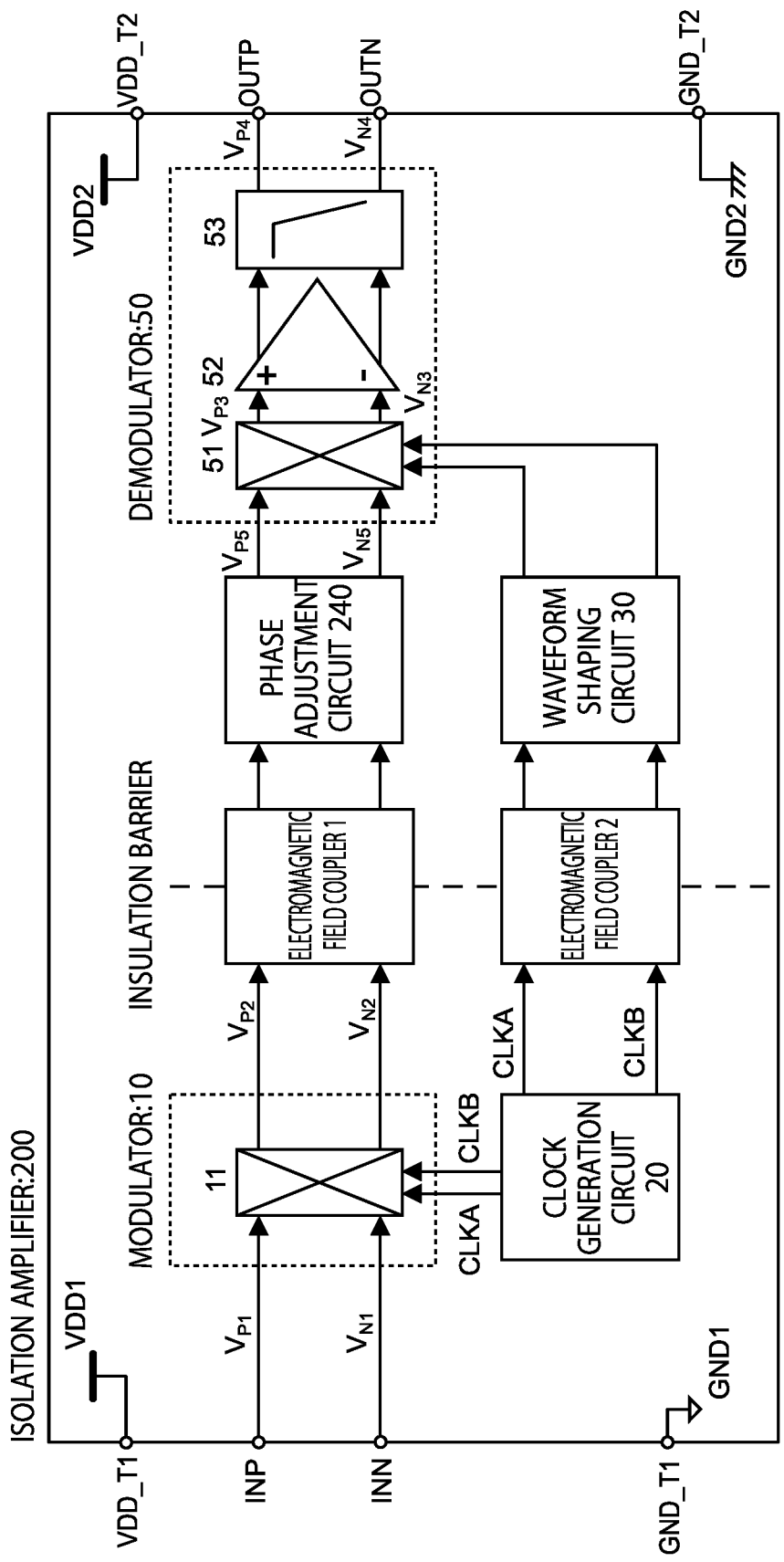
FIG. 7 is a diagram illustrating a configuration example of an isolation amplifier, as an electronic circuitry according to a second embodiment.

FIG. 7 illustrates a configuration example of an isolation amplifier 200, as an electronic circuitry according to the second embodiment. The configuration of the primary side is similar to that of the first embodiment. On the secondary side, a phase adjustment circuit 240 is provided between the electromagnetic field coupler 1 and the demodulator 50. No phase adjustment circuit is provided between the waveform shaping circuit 30 and the demodulator 50.

The phase adjustment circuit 240 delays the phases of the high-frequency signals $V_{P2}$ and $V_{N2}$ to be input from the electromagnetic field coupler 1 by the same amount or substantially the same amount as delayed phase amounts of the clock signals CLKA and CLKB generated in the waveform shaping circuit 30. The phase adjustment circuit 240 outputs delayed high-frequency signals $V_{P5}$ and $V_{N5}$ to the demodulator 50. The high-frequency signals $V_{P5}$ and $V_{N5}$ correspond to a sixth signal obtained by adjusting the phases of the high-frequency signals $V_{P2}$ and $V_{N2}$.

The clock signals CLKA and CLKB shaped by the waveform shaping circuit 30 are input to the demodulator 50. Since the phase differences between the high-frequency signals $V_{P5}$ and $V_{N5}$ to be input to the demodulator 50 and the clock signals CLKA and CLKB to be input to the demodulator 50 are small or zero, the high-frequency signals $V_{P5}$ and $V_{N5}$ can be demodulated with the maximum or large amplitude. As a result, it is possible to maximize or increase the SN ratio.

Third Embodiment

Figure 8:
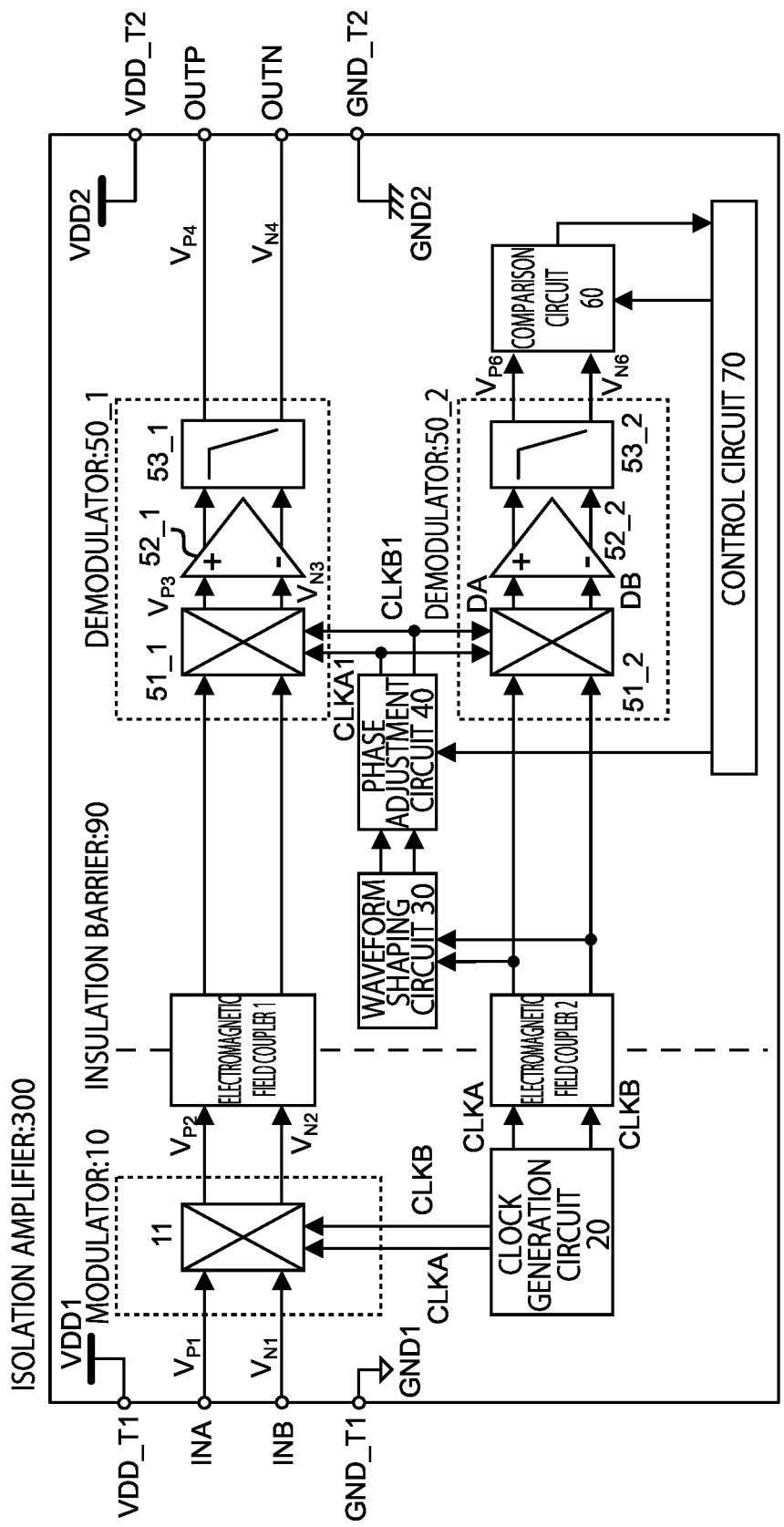
FIG. 8 is a diagram illustrating a configuration example of an isolation amplifier, as an electronic circuitry according to a third embodiment.

FIG. 8 illustrates a configuration example of an isolation amplifier 300, as an electronic circuitry according to a third embodiment. The configuration of the primary side is similar to that of the first embodiment, and a demodulator 50_1 that demodulates the high-frequency signal transmitted via the electromagnetic field coupler 1 is similar, in configuration, to the demodulator 50 of the first embodiment. It is assumed that the electromagnetic field couplers 1 and 2 are the same in configuration. It is also assumed that the phase delay amount from the electromagnetic field coupler 1 to the demodulator 50_1 is the same as the phase delay amount from the electromagnetic field coupler 2 to a demodulator 50_2.

On the secondary side, a waveform shaping circuit 30 and a phase adjustment circuit 40 are provided, like the first embodiment. In addition, the demodulator 50_2 is provided. The clock signals CLKA and CLKB transmitted to the secondary side via the electromagnetic field coupler 2 are input not only to the waveform shaping circuit 30 but also to the demodulator 50_2. The clock signals CLKA1 and CLKB1 phase-adjusted by the phase adjustment circuit 40 are input not only to the demodulator 50_1 but also to the demodulator 50_2.

The demodulator 50_2 (third conversion circuit) converts the clock signals CLKA and CLKB input via the electromagnetic field coupler 2 based on the phase-adjusted clock signals CLKA1 and CLKB1 to be input from the phase adjustment circuit 40. As a result, DC voltage signals (DC voltage signals or first DC voltage signals) corresponding to the amplitudes of the clock signals CLKA and CLKB are generated. In the present embodiment, converting the clock signal into the DC voltage signal in this manner is also referred to as demodulating the clock signal. The demodulator 50_2 includes a frequency converter 51_2, an amplifier 52_2, and a low pass filter 53_2.

The frequency converter 51_2, the amplifier 52_2, and the low pass filter 53_2 are similar, in configuration, to a frequency converter 51_1, an amplifier 52_1, and a low pass filter 53_1 in the demodulator 50_1. Accordingly, like the frequency converter 51_1, the configuration of FIG. 4A or FIG. 4B can be used as a configuration example of the frequency converter 51_2.

In the configuration illustrated in FIG. 4A or FIG. 4B, the clock signals CLKA and CLKB to be transmitted by the electromagnetic field coupler 2 are input to the terminals INA and INB, respectively. The input clock signals CLKA and CLKB are sampled based on the clock signals CLKA1 and CLKB1 input from the phase adjustment circuit 40, and made into non-pulsed signals DA and DB. The signals DA and DB correspond to a non-pulsed third signal generated by the frequency converter 51_2.

The signals DA and DB are respectively amplified by the amplifier 52_2, and the amplified signals DA and DB are input to the low pass filter 53_2. The low pass filter 53_2 attenuates or reduces high-frequency components (high-frequency components contained in the clock signals CLKA1, CLKB1, CLKA, and CLKB) from the amplified signals DA and DB. Then, attenuated or reduced signals are output as DC voltage signals $V_{P6}$ and $V_{N6}$. The DC voltage signals $V_{P6}$ and $V_{N6}$ are input to a comparison circuit 60. The DC voltage signals $V_{P6}$ and $V_{N6}$ correspond to the first DC voltage signals having amplitudes according to the clock signals CLKA and CLKB.

Figure 9:
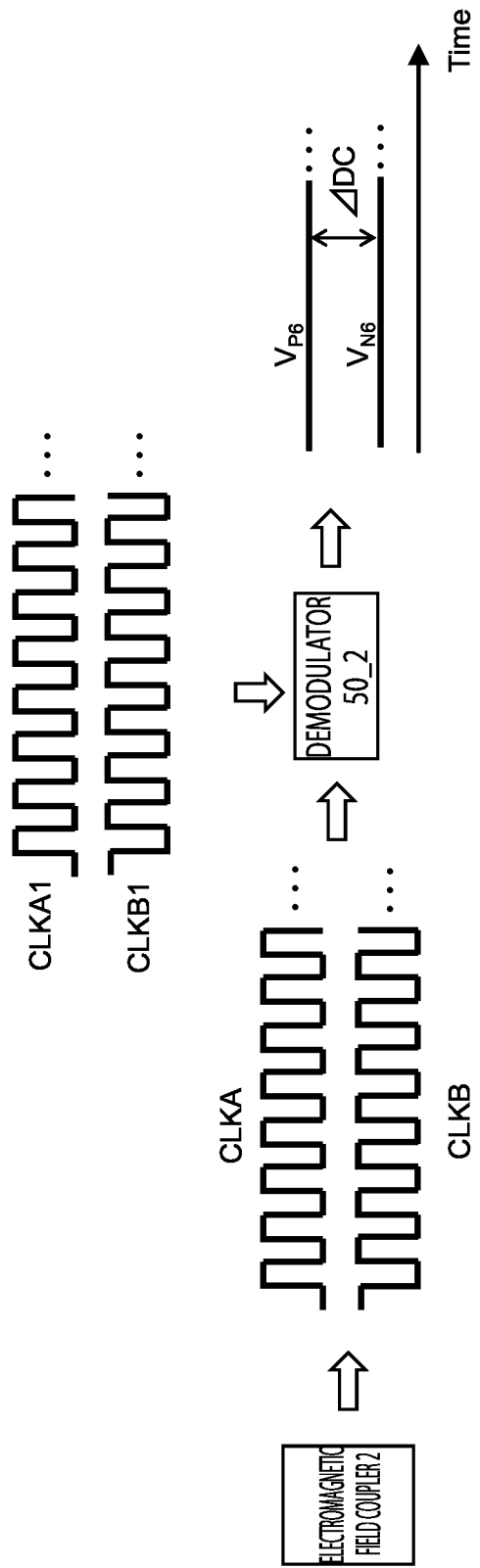
FIG. 9 is a diagram illustrating an example in which transmitted clock signals are converted into DC voltage signals based on phase-adjusted clock signals.

FIG. 9 illustrates an example in which the clock signals CLKA and CLKB are converted by the demodulator 50_2 based on the clock signals CLKA1 and CLKB1 to be input from the phase adjustment circuit 40, and output as the DC voltage signals $V_{P6}$ and $V_{N6}$. The difference between the DC voltage signals $V_{P6}$ and $V_{N6}$ corresponds to ADC.

The comparison circuit 60 compares the difference between DC voltage signals $V_{P6}$ and $V_{N6}$ currently input with the difference between DC voltage signals $V_{P6}$ and $V_{N6}$ input in the past, in response to a trigger signal from a control circuit 70, and transmits a signal indicating the result of comparison to the control circuit 70. Details of the comparison circuit 60 will be described below.

The control circuit 70 changes the phase adjustment amount of the phase adjustment circuit 40, and causes the comparison circuit 60 to compare the difference between DC voltage signals $V_{P6}$ and $V_{N6}$ before the change and the difference between DC voltage signals $V_{P6}$ and $V_{N6}$ after the change, to acquire the result of comparison. The control circuit 70 repeats changing the phase adjustment amount and acquiring the comparison result, and determines a phase adjustment amount to be set in the phase adjustment circuit 40 based on each comparison result. The phases of the high-frequency signals and the clock signals to be input to the demodulator 50_1 are matched, and the amplitudes of the output signals (restoration signals) $V_{P4}$ and $V_{N4}$ from the demodulator 50_1 can be maximized or increased.

Figure 10:
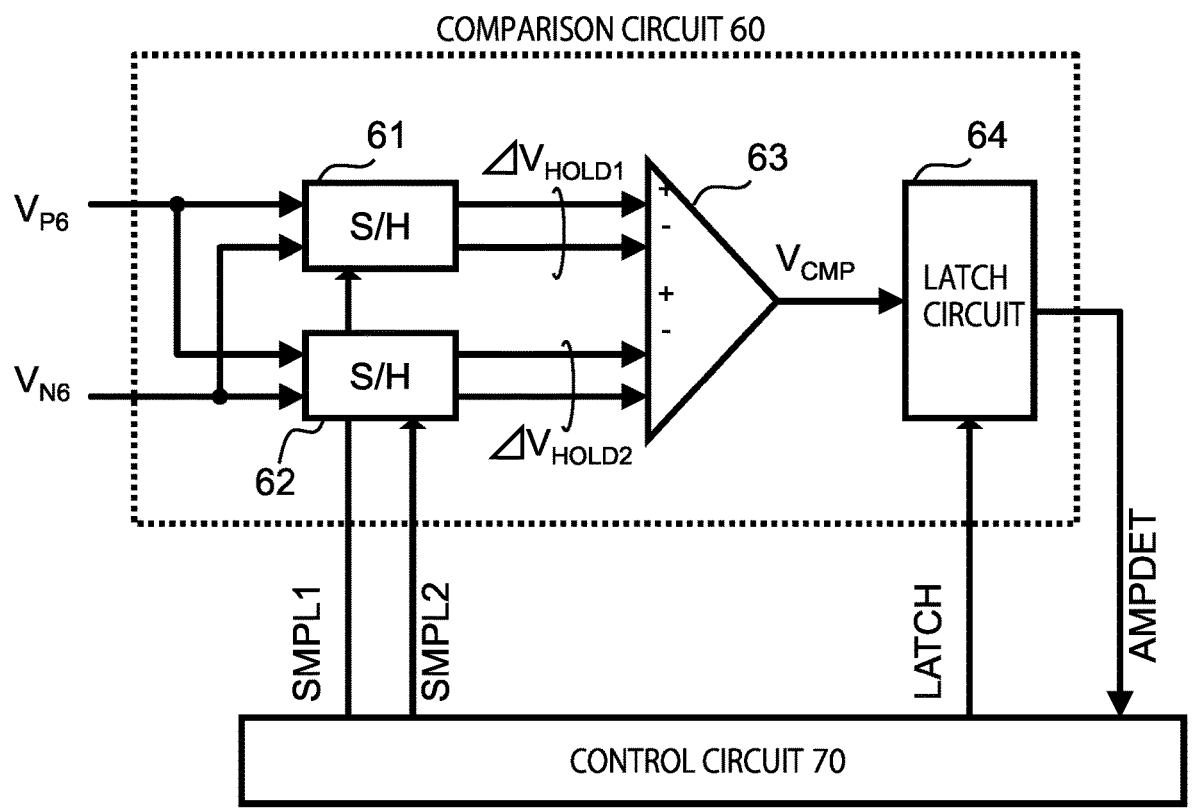
FIG. 10 is a diagram illustrating a configuration example of a comparison circuit.

FIG. 10 illustrates a configuration example of the comparison circuit 60. The comparison circuit 60 includes sample hold circuits 61 and 62 (referred to as S/H in the drawing), a comparator 63, and a latch circuit 64.

The sample hold circuit 61 receives a signal representing a command to hold the voltage (i.e., a sampling command signal) SMPL1 from the control circuit 70 and holds the difference between the DC voltage signals $V_{P6}$ and $V_{N6}$ to be input as $\Delta V_{HOLD1}$.

The sample hold circuit 62 receives a signal representing a command to hold the voltage (i.e., a sampling command signal) SMPL2 from the control circuit 70 and holds the difference between the DC voltage signals $V_{P6}$ and $V_{N6}$ to be input as $\Delta V_{HOLD2}$. The control circuit 70 can cause the sample hold circuits 61 and 62 to hold the voltage difference between different phase adjustment amounts by differentiating the transmission timing of the signal SMPL1 from the transmission timing of the signal SMPL2.

The comparator 63 compares the voltage difference $\Delta V_{HOLD1}$ input from the sample hold circuit 61 with the voltage difference $\Delta V_{HOLD2}$ input from the sample hold circuit 62, and outputs a signal VCMP indicating the result of comparison to the latch circuit 64. As an example, when the difference $\Delta V_{HOLD2}$ is greater than the difference $\Delta V_{HOLD1}$, the signal VCMP is a high-level signal. When the difference $\Delta V_{HOLD1}$ is greater than the difference $\Delta V_{HOLD2}$, the signal VCMP is a low-level signal. However, this relationship may be reversed. Comparing the difference $\Delta V_{HOLD1}$ with the difference $\Delta V_{HOLD2}$ corresponds to an example of comparing the voltages of the first DC voltage signals acquired when different phase adjustment amounts are set.

The latch circuit 64 receives a signal LATCH indicating a latch instruction from the control circuit 70, latches (holds) the signal VCMP, and transmits a latched signal AMPDET to the control circuit 70. The signal LATCH is, as an example, a digital signal of bit 0 or 1. The control circuit 70 can recognize a magnitude correlation between $\Delta V_{HOLD1}$ and $\Delta V_{HOLD2}$ based on the signal AMPDET.

Figure 11:
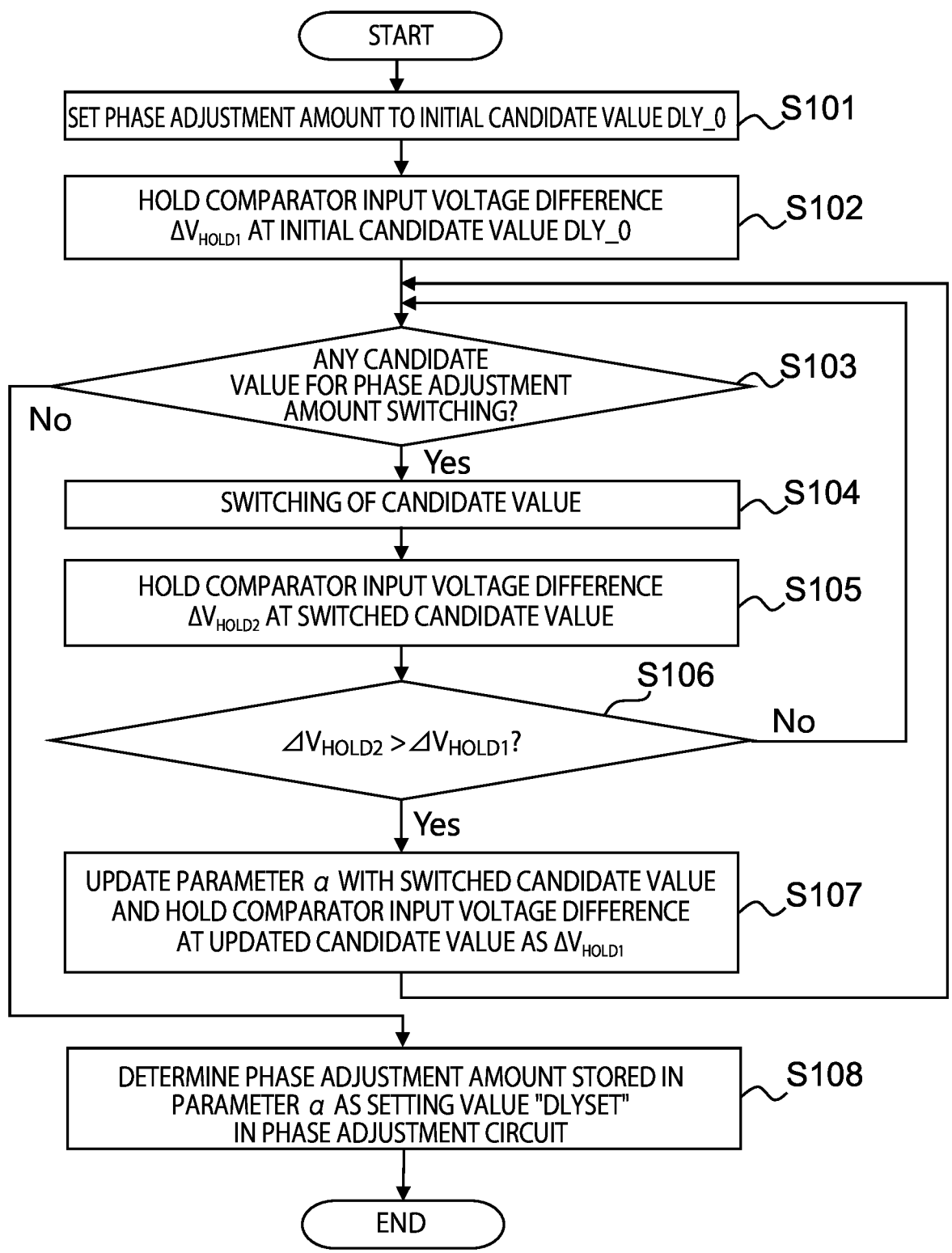
FIG. 11 is a diagram illustrating an example of an operation flow of clock phase adjustment.

FIG. 11 illustrates an example of an operation flow of clock phase adjustment to be performed by the comparison circuit 60, the phase adjustment circuit 40, and the control circuit 70. The clock phase adjustment operation is executed when power is turned ON, or when a phase adjustment execution signal is input from the outside. Alternatively, a timer or the like may be used to periodically execute the clock phase adjustment operation at arbitrary intervals.

The control circuit 70 sets the phase adjustment amount of the phase adjustment circuit 40 to an initial candidate value (DLY_0) among a plurality of candidate values DLY_0 to DLY_N (S101). The control circuit 70 stores the candidate value (DLY_0) to a parameter a.

The comparison circuit 60, when the phase adjustment amount of the phase adjustment circuit 40 is set to the candidate value (DLY_0), causes the sample hold circuit 61 to hold the difference between the DC voltage signals $V_{P6}$ and $V_{N6}$ to be input from the demodulator 50_2 as $\Delta V_{HOLD1}$ (S102).

The control circuit 70 switches the phase adjustment amount candidate value in the phase adjustment circuit 40 to another candidate value (DLY_1) (S103, S104). The comparison circuit 60, when the phase adjustment amount of the phase adjustment circuit 40 is set to the candidate value (DLY_1), causes the sample hold circuit 62 to hold the difference between the DC voltage signals $V_{P6}$ and $V_{N6}$ to be input from the demodulator 50_2 as $\Delta V_{HOLD2}$ (S105).

The comparison circuit 60 compares the difference $\Delta V_{HOLD1}$ with the difference $\Delta V_{HOLD2}$ (S106). When $\Delta V_{HOLD2}$ is greater than $\Delta V_{HOLD1}$, the control circuit 70 updates the parameter a with the present phase adjustment amount candidate value (DLY_1) (S107). Further, the control circuit 70 causes the sample hold circuit 61 to hold the difference $\Delta V_{HOLD2}$ held in the sample hold circuit 62 as the difference $\Delta V_{HOLD2}$ (in the same step S107). More specifically, the control circuit 70 inputs the DC voltage signals $V_{P6}$ and $V_{N6}$ at the present phase adjustment amount candidate value (DLY_1) to the sample hold circuit 61, and causes the sample hold circuit 61 to hold the voltage difference between the DC voltage signals $V_{P6}$ and $V_{N6}$ as $\Delta V_{HOLD1}$.

By repeating the processing of steps S103 to S107 for all the remaining phase adjustment amount candidate values (DNY_M: M is 3 to N), the phase adjustment amount that maximizes the difference between the DC voltage signals $V_{P6}$ and $V_{N6}$ is stored in the parameter a. The control circuit 70 determines the phase adjustment amount stored in the parameter a as a phase adjustment amount setting value DLYSET in the phase adjustment circuit 40.

Figure 12:
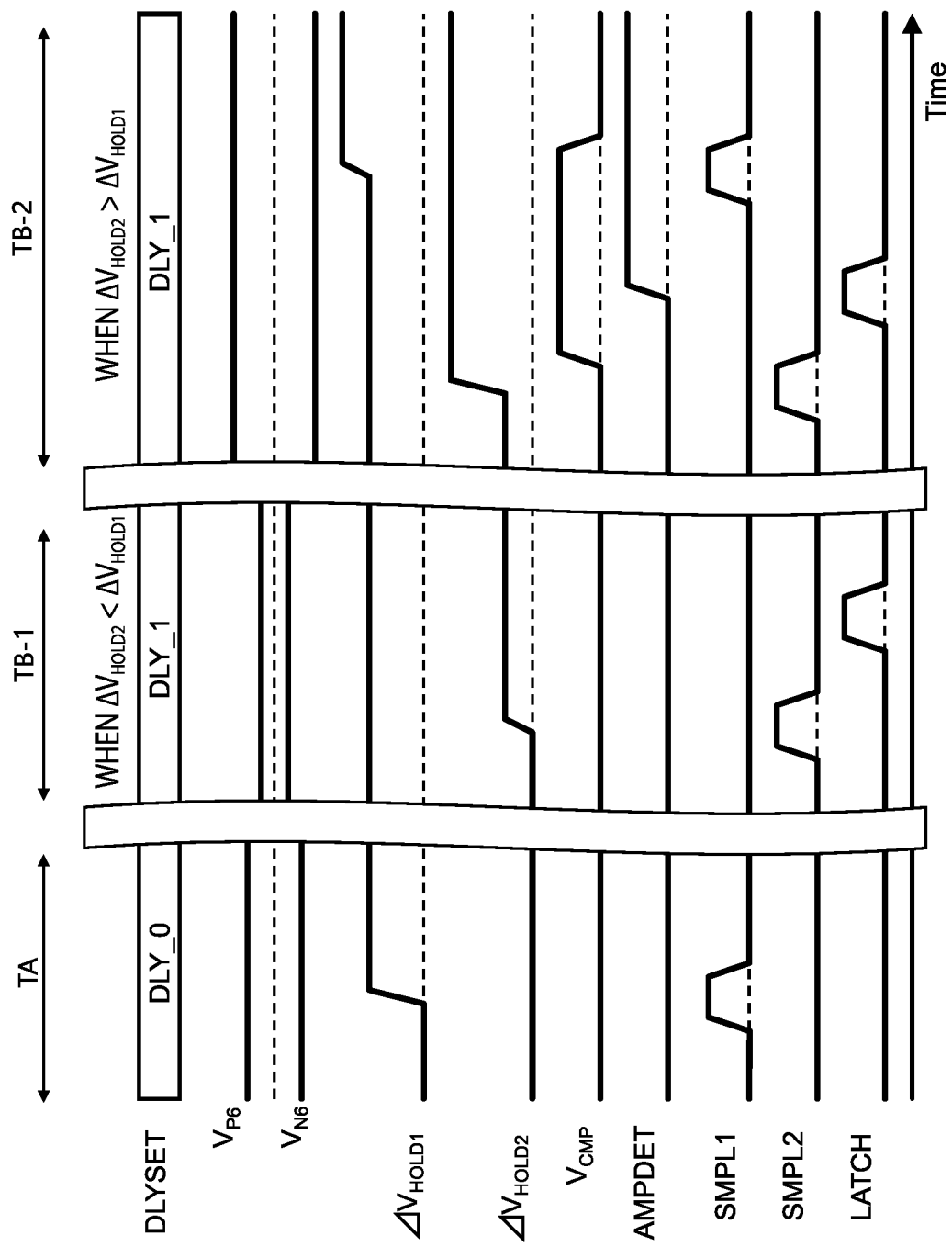
FIG. 12 is a diagram illustrating a timing chart example of each signal in the comparison circuit.

FIG. 12 illustrates a timing chart example of each signal in the comparison circuit 60. Timing charts TA, TB-1, and TB-2 are illustrated in FIG. 12. The timing chart TA is a timing chart of operations to be performed when the candidate value DLY_0 is set as an initial value. The timing chart TB-1 is a timing chart of operations following the operations corresponding to the timing chart TA when the candidate value DLY_1 is set and it is determined that $\Delta V_{HOLD1}$ is greater than $\Delta V_{HOLD2}$. The timing chart TB-2 is a timing chart of operations following the operations corresponding to the timing chart TA when the candidate value DLY_1 is set and it is determined that $\Delta V_{HOLD2}$ is greater than $\Delta V_{HOLD1}$. Accordingly, the timing chart TA is followed by either the timing chart TB-1 or the timing chart TB-2. The timing charts TA, TB-1, and TB-2 will be described in association with the flowchart of FIG. 11.

[Timing Chart TA]

The control circuit 70 sets the candidate value DLY_0 in the phase adjustment circuit 40 (S101), and the sample hold circuit 61 receives the DC voltage signals $V_{P6}$ and $V_{N6}$ to be output from the demodulator 50_2. The sample hold circuit 61 receives the signal SMPL1 from the control circuit 70, and holds the voltage difference $\Delta V_{HOLD1}$ between the DC voltage signals $V_{P6}$ and $V_{N6}$ (S102).

[Timing Chart TB-1]

The control circuit 70 sets the candidate value DLY_1 in the phase adjustment circuit 40 (S103, S104), and the sample hold circuit 62 receives the DC voltage signals $V_{P6}$ and $V_{N6}$ to be output from the demodulator 50_2. The sample hold circuit 62 receives the signal SMPL2 from the control circuit 70, and holds the voltage difference $\Delta V_{HOLD2}$ between the DC voltage signals $V_{P6}$ and $V_{N6}$ (S105).

The comparator 63 compares $\Delta V_{HOLD1}$ with $\Delta V_{HOLD2}$ (S106). As understood from FIG. 12, since $\Delta V_{HOLD1}$ is greater than $\Delta V_{HOLD2}$, the comparator 63 outputs a low-level signal as the signal $V_{CMP}$ indicating the result of comparison. The control circuit 70 inputs the LATCH signal to the latch circuit 64. The latch circuit 64 latches the low level and outputs the signal AMPDET. The signal AMPDET is the same low-level signal as the signal $V_{CMP}$.

Based on the signal AMPDET, the control circuit 70 recognizes that $\Delta V_{HOLD1}$ is greater than $\Delta V_{HOLD2}$ (No in S106). While holding the voltage difference held in the sample hold circuit 61 at the present $\Delta V_{HOLD1}$, the control circuit 70 changes the phase adjustment amount in the phase adjustment circuit 40 to the next candidate value DLY_2 (S103, 104). The control circuit 70 causes the sample hold circuit 62 to receive the DC voltage signals $V_{P6}$ and $V_{N6}$ to be output from the demodulator 50_2 as $V_{HOLD1\_P2}$ and $V_{HOLD1\_N2}$, respectively.

[Timing Chart TB-2]

The control circuit 70 sets the candidate value DLY_1 in the phase adjustment circuit 40 (S103, S104), and the sample hold circuit 62 receives the DC voltage signals $V_{P6}$ and $V_{N6}$ to be output from the demodulator 50_2. The sample hold circuit 62 receives the signal SMPL2 from the control circuit 70, and holds the voltage difference $\Delta V_{HOLD2}$ between the DC voltage signals $V_{P6}$ and $V_{N6}$ (S105).

The comparator 63 compares $\Delta V_{HOLD1}$ with $\Delta V_{HOLD2}$ (S106). As understood from FIG. 12, since $\Delta V_{HOLD2}$ is greater than $\Delta V_{HOLD1}$, the comparator 63 outputs a high-level signal as the signal $V_{CMP}$ indicating the result of comparison. The control circuit 70 inputs the LATCH signal to the latch circuit 64. The latch circuit 64 latches the high level and outputs the signal AMPDET. The signal AMPDET is the same high-level signal as the signal $V_{CMP}$.

Based on the signal AMPDET, the control circuit 70 recognizes that $\Delta V_{HOLD2}$ is greater than $\Delta V_{HOLD1}$ (Yes in S106). The control circuit 70 causes the sample hold circuit 61 to hold the voltage difference $\Delta V_{HOLD2}$ held by the sample hold circuit 62 as $\Delta V_{HOLD1}$ (S107). Specifically, while DLY_1 is set in the phase adjustment circuit 40, the control circuit 70 causes the sample hold circuit 61 to receive the DC voltage signals $V_{P6}$ and $V_{N6}$ to be output from the demodulator 50_1, respectively. By outputting the signal SMPL1 to the sample hold circuit 61, the control circuit 70 causes the sample hold circuit 61 to hold the voltage difference between the DC voltage signals $V_{P6}$ and $V_{N6}$. As understood from FIG. 12, the value of $\Delta V_{HOLD1}$ increases according to sampling at timing of signal SMPL1. Therefore, the control circuit 70 changes the phase adjustment amount in the phase adjustment circuit 40 to the next candidate value DLY_2, and causes the sample hold circuit 62 to receive the DC voltage signals $V_{P6}$ and $V_{N6}$ to be output from the demodulator 50_2 (S103, 104).

As described above, according to the present embodiment, maximizing the DC voltage difference to be output from the demodulator 50_2 can optimize the phases of the clock signals to be input to the demodulators 50_1 and 50_2. This makes it possible to maximize or increase the amplitude of the analog signal (restoration signal) to be output from the demodulator 50_1 and maximize or increase the SN ratio of the restoration signal.

Further, according to the present embodiment, instead of the output signal from the demodulator 50_1, the DC voltage to be output from the demodulator 50_2 is used to determine the phase adjustment amount to be set in the phase adjustment circuit 40. This makes it possible to optimize the phase adjustment amount to be set in the phase adjustment circuit 40, even in a state where no analog signal is input to the primary side, or in a state where no device for inputting analog signals is connected to the primary side.

Fourth Embodiment

Figure 13:
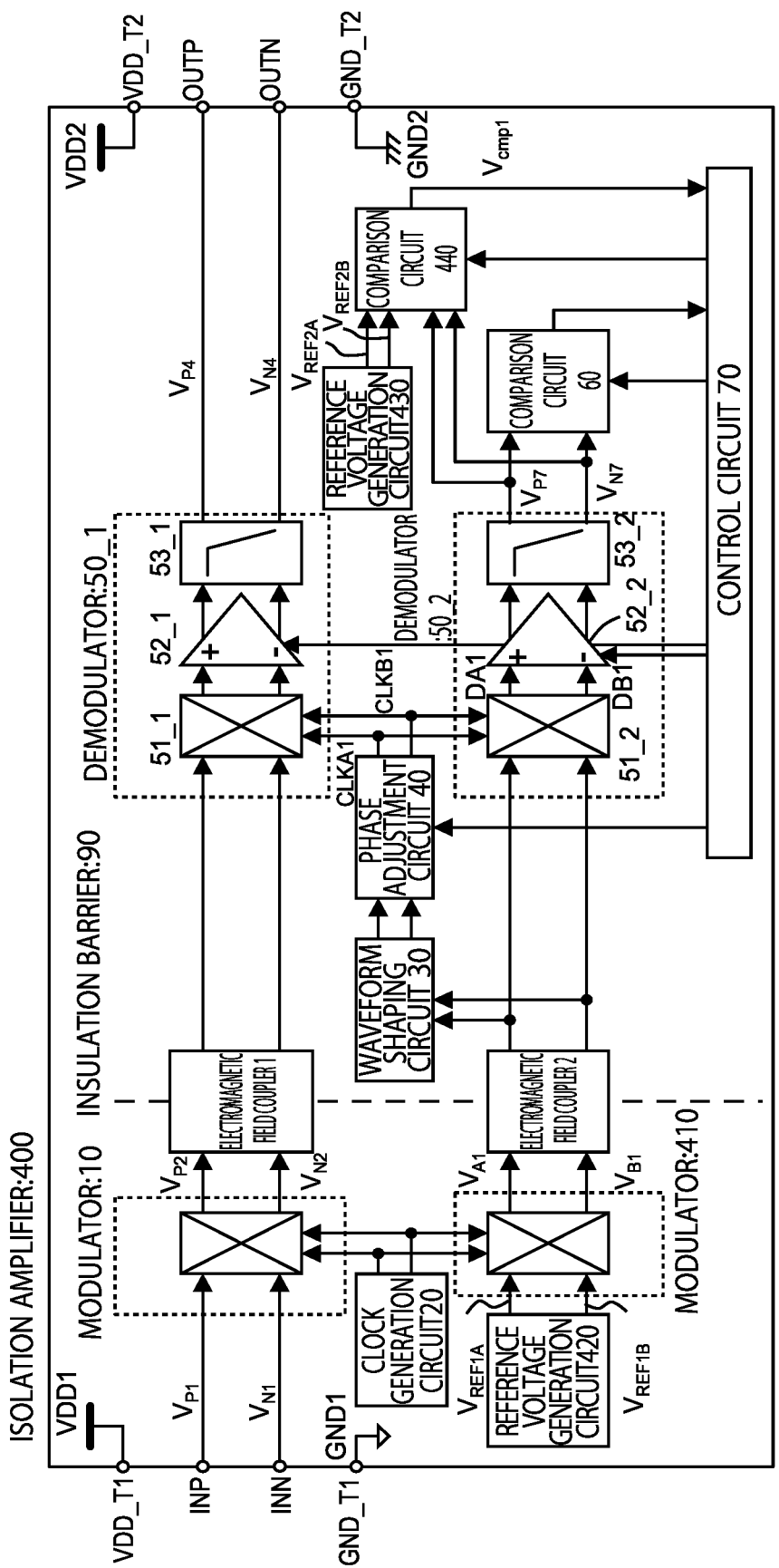
FIG. 13 is a diagram illustrating a configuration example of an isolation amplifier, as an electronic circuitry according to a fourth embodiment.

FIG. 13 illustrates a configuration example of an isolation amplifier 400, as an electronic circuitry according to a fourth embodiment. The fourth embodiment is similar to the third embodiment in the configuration for modulating input signals into high-frequency signals and demodulating the high-frequency signals into analog signals, and also in the configuration for performing phase adjustment of clock signals using the demodulation results of the clock signals. Further, it is assumed that the configurations of the electromagnetic field coupler 1 and the electromagnetic field coupler 2 are the same or substantially the same.

In the present fourth embodiment, a reference voltage generation circuit 420 and a modulator 410 (fourth conversion circuit) are provided on the primary side. The reference voltage generation circuit 420 generates reference voltage signals $V_{REF1A}$ and $V_{REF1B}$. The reference voltage signals $V_{REF1A}$ and $V_{REF1B}$ have mutually different DC voltages (reference voltages). As an example, the voltage of the reference voltage signal $V_{REF1A}$ is greater than the voltage of the reference voltage signal $V_{REF1B}$. The voltages of the reference voltage signals $V_{REF1A}$ and $V_{REF1B}$ are denoted as the reference numerals $V_{REF1A}$ and $V_{REF1B}$ by using the same reference numerals as the reference voltage signals $V_{REF1A}$ and $V_{REF1B}$. Therefore, the voltages of the reference voltage signals are hereinafter referred to as reference voltages $V_{REF1A}$ and $V_{REF1B}$. The reference voltage signals $V_{REF1A}$ and $V_{REF1B}$ correspond to a first reference voltage signal generated by the reference voltage generation circuit 420.

The modulator 410 (fourth conversion circuit) uses the clock signals CLKA and CLKB generated by the clock generation circuit 20 to convert the reference voltage signals $V_{REF1A}$ and $V_{REF1B}$ into high-frequency pulsed signals (or clock-like signals), and outputs high-frequency reference voltage signals $V_{A1}$ and $V_{B1}$. The pulsed signals (or clock-like signals) referred to here are periodic rectangular wave signals that are comparable, in pulse width and amplitude, to the above-described clock signals CLKA and CLKB. The high-frequency reference voltage signals $V_{A1}$ and $V_{B1}$ correspond to the third signal obtainable by converting the first reference voltage signal based on the first clock signal (the clock signals CLKA and CLKB). The third signal is a pulsed signal having a frequency (period) corresponding to the first clock signal.

The modulator 410 has a configuration similar to that of the modulator 10 (see FIG. 4). In FIG. 4A or FIG. 4B, the reference voltage signal $V_{REF1A}$ is input to the terminal INA, and the reference voltage signal $V_{REF1B}$ is input to the terminal INB. When the reference voltage signals $V_{REF1A}$ and $V_{REF1B}$ are sampled in mutually opposite directions according to the clock signals CLKA and CLKB, the high-frequency reference voltage signal $V_{A1}$ is output from the terminal OUTA and the high-frequency reference voltage signal $V_{B1}$ is output from the terminal OUTB. Each of the high-frequency reference voltage signals $V_{A1}$ and $V_{B1}$ includes information on the clock signals CLKA and CLKB and voltage information on the reference voltage signals $V_{REF1A}$ and $V_{REF1B}$.

Although the clock signals CLKA and CLKB are input to the electromagnetic field coupler 2 in the first to third embodiments, the high-frequency reference voltage signals $V_{A1}$ and $V_{B1}$ are input to the electromagnetic field coupler 2 from the modulator 410 in the fourth embodiment. The high-frequency reference voltage signals Val and $V_{B1}$ are transmitted, via the electromagnetic field coupler 2, to the secondary side.

On the secondary side, a waveform shaping circuit 30 receives the transmitted high-frequency reference voltage signals $V_{A1}$ and $V_{B1}$. The high-frequency reference voltage signals $V_{A1}$ and $V_{B1}$ are shaped by the waveform shaping circuit 30 and then their phases are adjusted by a phase adjustment circuit 40. The waveform-shaped and phase-adjusted high-frequency reference voltage signals Val and $V_{B1}$ are supplied, as clock signals CLKA1 and CLKB1, to the demodulators 50_1 and 50_2.

Further, the high-frequency reference voltage signals $V_{A1}$ and $V_{B1}$ transmitted via the electromagnetic field coupler 2 are also input to the demodulator 50_2 (fifth conversion circuit). The demodulator 50_2 converts the high-frequency reference voltage signals $V_{A1}$ and $V_{B1}$, based on the clock signals CLKA1 and CLKB1 from the phase adjustment circuit 40, into DC voltage signals $V_{P7}$ and $V_{N7}$ (second DC voltage signal) corresponding to the amplitudes of the high-frequency reference voltage signals Val and $V_{B1}$. That is, the high-frequency reference voltage signals $V_{A1}$ and $V_{B1}$ are reduced in frequency (demodulated) based on the clock signals CLKA1 and CLKB1. The demodulator 50_2 operates in the same manner as in the third embodiment, and only the input signals are different.

More specifically, the frequency converter 51_2 in the demodulator 50_2 samples the input high-frequency reference voltage signals Val and $V_{B1}$ in mutually opposite directions, based on the clock signals CLKA1 and CLKB1 to be input from the phase adjustment circuit 40, and outputs non-pulsed signals DA1 and DB1 (fourth signal). The non-pulsed signals (or non-clock-like signals) referred to here are signals in which at least one of the pulse width and amplitude of the pulsed signals is reduced so that DC components become dominant, and high-frequency components corresponding to at least one of the reduced pulse width and amplitude may remain. An amplifier 52_2 respectively amplifies the signals DA1 and DB1. A low pass filter 53_2 receives the amplified signals. The low pass filter 53_2 attenuates or reduces high-frequency components (high-frequency components contained in the clock signals CLKA1 and CLKB1 and the high-frequency reference voltage signals $V_{A1}$ and $V_{B1}$) from the amplified signals, and outputs the attenuated or reduced signals as the DC voltage signals $V_{P7}$ and $V_{N7}$ (the second DC voltage signal). A comparison circuit 60 receives the DC voltage signals $V_{P7}$ and $V_{N7}$. The comparison circuit 60 operates in the same manner as in the third embodiment to generate a signal (comparison result signal) $V_{CMP}$ indicating the result of comparison, and transmits the signal $V_{CMP}$ to a control circuit 70. As in the third embodiment, the control circuit 70 acquires a plurality of comparison results by setting a plurality of phase adjustment amount candidates in the phase adjustment circuit 40, to determine a phase adjustment amount to be set in the phase adjustment circuit 40.

Further, a comparison circuit 440 receives the DC voltage signals $V_{P7}$ and $V_{N7}$ to be output from the demodulator 50_2. A reference voltage generation circuit 430 generates reference voltage signals $V_{REF2A}$ and $V_{REF2B}$, and outputs the reference voltage signals $V_{REF2A}$ and $V_{REF2B}$ to the comparison circuit 440. The reference voltage signals $V_{REF2A}$ and $V_{REF2B}$ have mutually different DC voltages. The DC voltages of the reference voltage signals $V_{REF2A}$ and $V_{REF2B}$ are denoted as the reference voltages $V_{REF2A}$ and $V_{REF2B}$ by using the same reference numerals as the reference voltage signals $V_{REF2A}$ and $V_{REF2B}$. Therefore, the DC voltages of the reference voltage signals are hereinafter referred to as reference voltages $V_{REF2A}$ and $V_{REF2B}$. The difference ($\Delta$REF) between the reference voltages $V_{REF2A}$ and $V_{REF2B}$ is the same value as the difference between the reference voltages $V_{REF1A}$ and $V_{REF1B}$ generated by the reference voltage generation circuit 420. The reference voltage $V_{REF2A}$ may be the same as the reference voltage $V_{REF1A}$. The reference voltage $V_{REF2B}$ may be the same as the reference voltage $V_{REF1B}$. The reference voltages $V_{REF2A}$ and $V_{REF2B}$ correspond to a second reference voltage.

The comparison circuit 440 compares the difference (referred to as difference $\Delta$REF) between the reference voltages $V_{REF2A}$ and $V_{REF2B}$ with the difference (referred to as difference $\Delta$DC) between the DC voltage signals $V_{P7}$ and $V_{N7}$, in response to a trigger signal from the control circuit 70, and obtains a signal indicating the result of comparison (a comparison result signal) $V_{CMP1}$. The comparison result signal $V_{CMP1}$ is, for example, a signal indicating whether the difference $\Delta$DC is greater than the difference $\Delta$REF. The control circuit 70 receives the comparison result signal $V_{CMP1}$. Comparing the difference $\Delta$DC with the difference $\Delta$REF corresponds to an example of comparing the voltage of the second DC voltage signal (DC voltage signals $V_{P7}$ and $V_{N7}$) with the second reference voltage.

The control circuit 70 adjusts amplification amounts (gains) of an amplifier 52_1 of the demodulator 50_1 and an amplifier 52_2 of the demodulator 50_2, respectively, according to the comparison result signal $V_{CMP1}$. More specifically, the control circuit 70 adjusts gain adjustment signals to be output to the amplifier 52_1 and the amplifier 52_2, respectively.

Based on the comparison result signal $V_{CMP1}$, when the difference $\Delta$DC is greater than the difference $\Delta$REF, the control circuit 70 changes the gain adjustment signals to be output to the amplifiers 52_1 and 52_2 so that the gains of the amplifiers 52_1 and 52_2 decrease. The reduction amount may be a constant value or a constant ratio, or may be a value determined by other methods. The gain change amounts of the amplifiers 52_1 and amplifier 52_2 may be the same or different.

When the difference $\Delta$DC is smaller than the difference $\Delta$REF, the control circuit 70 changes the gain adjustment signals to be output to the amplifiers 52_1 and 52_2 so that the gains of the amplifiers 52_1 and 52_2 increase. The gain increase amount may be a constant value or a constant ratio, or may be a value determined by other methods. The gain change amounts of the amplifier 52_1 and the amplifier 52_2 may be the same or different.

Since the electromagnetic field coupler 1 and the electromagnetic field coupler 2 are the same or substantially the same in configuration, the attenuation amounts in the electromagnetic field couplers 1 and 2 are the same or substantially the same. Accordingly, changing the gains of the amplifiers 52_1 and 52_2 in such a way as to equalize the voltage difference between the DC voltage signals $V_{P7}$ and $V_{N7}$ with the difference between the reference voltages $V_{REF2A}$ and $V_{REF2B}$ can cancel the attenuation amounts generated in the electromagnetic field couplers 1 and 2 on the secondary side. This makes it possible to perform calibration of the gain from the input to the output of the present electronic circuitry.

Figure 14:
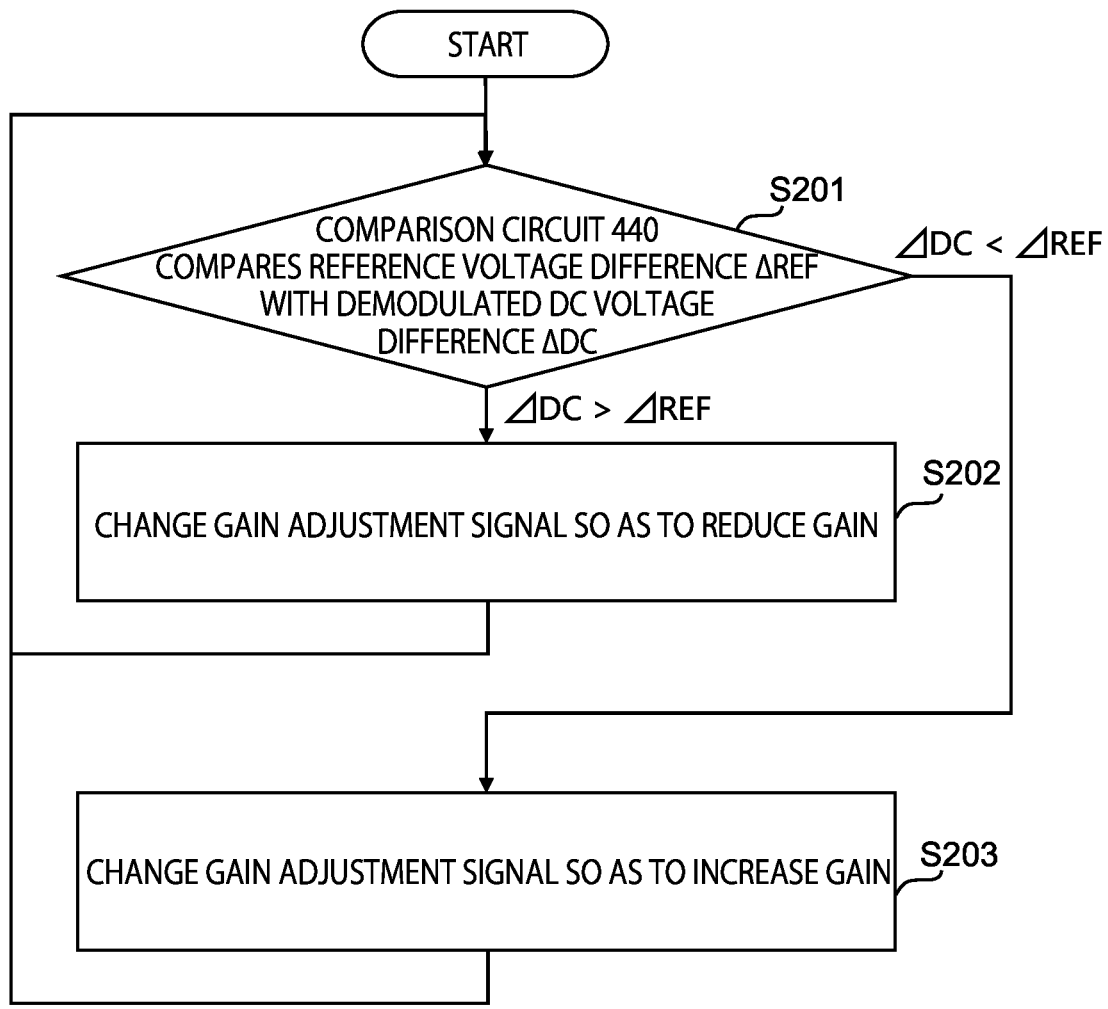
FIG. 14 is a diagram illustrating an example of an operation flow of amplifier gain adjustment.

FIG. 14 illustrates an example of an operation flow of adjusting gains of the amplifiers 52_1 and 52_2 by the comparison circuit 440 and the control circuit 70. The gain adjustment operation may be performed once after the completion of clock signal phase adjustment after power is turned ON, or may be constantly performed while the circuit is in operation after completion of the phase adjustment. Alternatively, the gain adjustment operation may be performed when a gain adjustment execution signal is input from an external device, or may be periodically performed at arbitrary intervals using a timer or the like.

The comparison circuit 440 compares the DC voltage signal voltage difference $\Delta$DC from the demodulator 50_2 with the difference $\Delta$REF between the reference voltages $V_{REF2A}$ and $V_{REF2B}$ (S201). When the difference $\Delta$DC is greater than the difference $\Delta$REF, the control circuit 70 changes the gain adjustment signals to be output to the amplifiers 52_1 and 52_2 so as to reduce the gains of the amplifiers 52_1 and 52_2 (S202). When the difference $\Delta$DC is smaller than the difference $\Delta$REF, the control circuit 70 changes the gain adjustment signals to be output to the amplifiers 52_1 and 52_2 so as to increase the gains of the amplifiers 52_1 and 52_2 (S203).

As described above, according to the present embodiment, it is possible to reduce the phase difference between the high-frequency signal and the clock signal, and it is possible to restore the analog signal with the maximum amplitude. As a result, the SN ratio can be maximized or increased.

Fifth Embodiment

Figure 15:
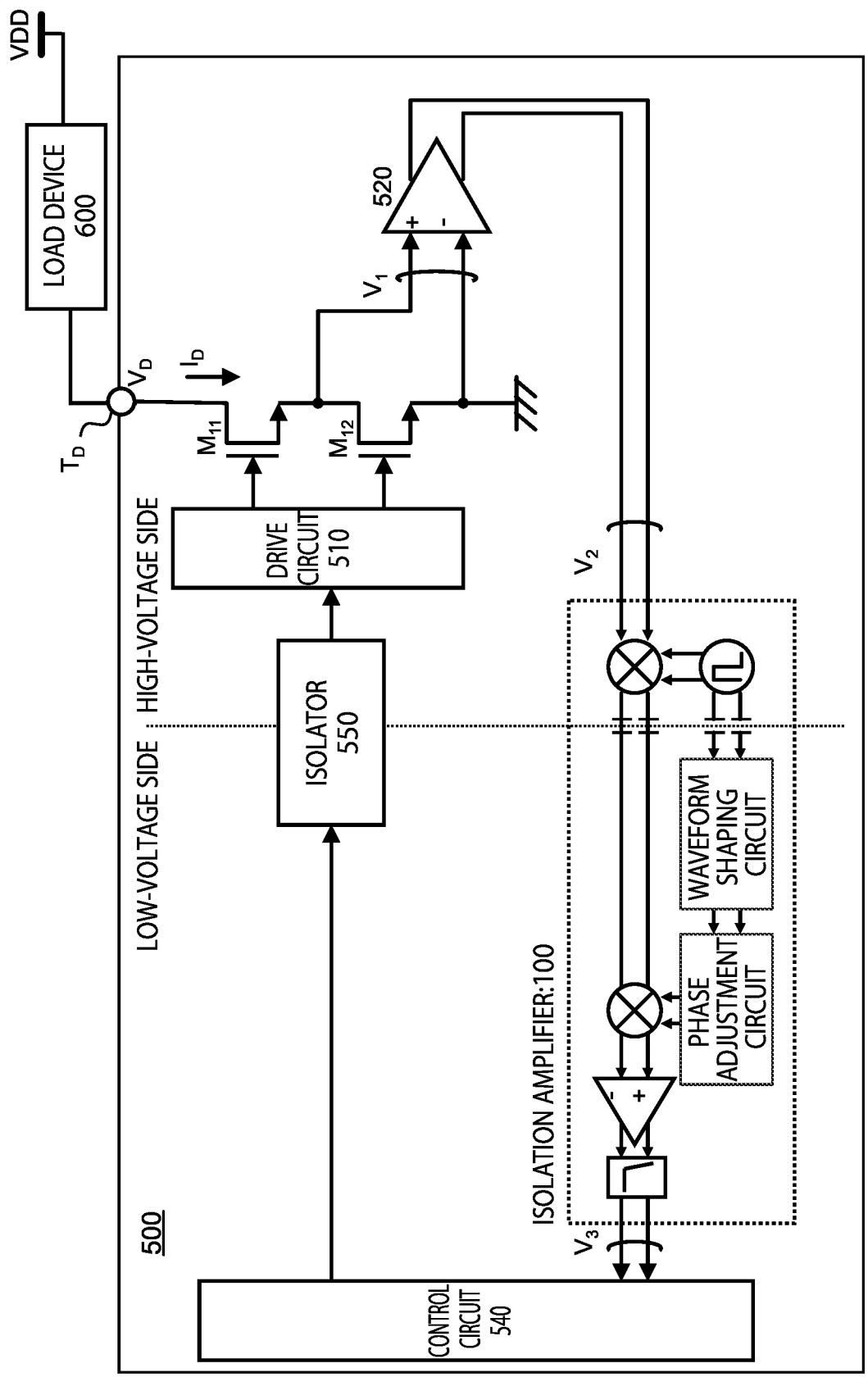
FIG. 15 is a diagram illustrating a configuration example of a power converter that uses an isolation amplifier, as an electronic circuitry according to a fifth embodiment.

FIG. 15 illustrates a configuration example of a power converter 500, as an electronic circuitry that uses the isolation amplifier 100 according to the first embodiment. The isolation amplifier 100 according to the first embodiment may be replaced with any one of the isolation amplifiers of the second to fourth embodiments.

The power converter 500 is connected to a load device 600 via a terminal $T_D$. The power converter 500 is provided with a high-voltage side circuit and a low-voltage side circuit. On the high-voltage side, switching elements $M_{11}$ and $M_{12}$ are connected in series. The switching element $M_{11}$ has one end connected to the load device 600 via the terminal $T_D$, and the other end connected to one end of the switching element $M_{12}$. The switching element $M_{12}$ has the other end connected to the reference potential. The voltage at the terminal $T_D$ is $V_D$. The switching elements $M_{11}$ and $M_{12}$ are switching elements such as GaN elements, LVMOS elements, or SiC elements, as an example. The switching element $M_{11}$ is, for example, a normally ON type, and the switching element $M_{12}$ is, for example, a normally OFF type. The power converter 500 turns on and off the switching elements $M_{11}$ and $M_{12}$ to supply electric power to the load device 600 connected to the terminal $T_D$.

A drive circuit 510 (gate driver) is provided on the high-voltage side. The drive circuit 510 (gate driver) supplies gate signals (control signals) to gate terminals (control terminals) of the switching elements $M_{11}$ and $M_{12}$. In response to the gate signals, each of switching elements $M_{11}$ and $M_{12}$ is switched between ON state and OFF state, so as to control the current $I_D$ flowing through the load device 600. In order to reduce the loss due to the switching elements and improve the conversion efficiency of the entire power converter, it is necessary to detect the current $I_D$ with high accuracy and high speed and feed the detected current $I_D$ back to a control circuit 540 on the low-voltage side.

The one end of the switching element $M_{12}$ is connected to a plus input terminal of an amplifier 520, and the other end of the switching element $M_{12}$ is connected to a minus input terminal of the amplifier 520. The amplifier 520 includes a detection circuit that detects a voltage $V_1$ between both of these terminals. The voltage $V_1$ can be calculated based on an ON-resistance (referred to as $R_{ON}$) of the switching element Mie and the flowing current $I_D$, according to the following formula (1).

$$V_1 = R_{ON} \times I_D \qquad (1)$$

The amplifier 520 amplifies the detected voltage $V_1$ with an amplification factor A. The isolation amplifier 100 receives an analog signal (voltage signal) representing an amplified voltage $V_2$, via plus and minus output terminals of the amplifier 520. The analog signal to be input from the plus output terminal of the amplifier 520 to the isolation amplifier 100 corresponds to the analog signal to be input to the input terminal INP of the isolation amplifier 100 in FIG. 1. The analog signal to be input from the minus output terminal of the amplifier 520 to the isolation amplifier 100 corresponds to the analog signal to be input to the input terminal INN of the isolation amplifier 100 of FIG. 1. The voltage $V_2$ after amplification in the amplifier 520 can be represented by the following formula (2) based on the ON-resistance $R_{ON}$, the current $I_D$, and the amplification factor A.

$$V_2 = A \times V_1 = A \times R_{ON} \times I_D \qquad (2)$$

The isolation amplifier 100 transmits the analog signal indicating the input voltage $V_2$ from the high-voltage side (the primary side) to the low-voltage side (the secondary side), and outputs a voltage $V_3$ indicated by the transmitted analog signal to the control circuit 540 on the low-voltage side. The voltage difference between the analog signal output from the output terminal OUTP (see FIG. 1) and the analog signal output from the output terminal OUTN (see FIG. 1) in the isolation amplifier 100 corresponds to the voltage $V_3$. When the amplification factor of the isolation amplifier 100 is 1 (0 dB), the voltage $V_3$ can be expressed by the following formula (3).

$$V_3 = V_2 = A \times R_{ON} \times I_D \qquad (3)$$

On the low-voltage side (the secondary side), the control circuit 540 determines ON-OFF timings of the switching elements $M_{11}$ and $M_{12}$ based on the voltage $V_3$ indicated by the signal input from the isolation amplifier 100, and generates timing signals that instruct the determined timings. More specifically, the control circuit 540 calculates the value of the current $I_D$ from the amplification factor A of the amplifier 520, the ON-resistance $R_{ON}$ of the switching element $M_{12}$, and the voltage $V_3$, based on the formula (3), and determines the ON-OFF timings of the switching elements $M_{11}$ and $M_{12}$ according to the calculated value of the current $I_D$. That is, the control circuit 540 performs gate control for the switching elements $M_{11}$ and $M_{12}$.

The control circuit 540 transmits the timing signals indicating the ON-OFF timings of the switching elements $M_{11}$ and $M_{12}$, via an isolator 550, to the drive circuit 510. The isolator 550 is an insulator that insulates between the primary side and the secondary side. The isolator 550 can be configured by capacitors or transformers (see FIG. 4). A photocoupler or a digital isolator may be used for the isolator 550. The drive circuit 510 generates gate signals based on the timing signals received via the isolator 550 from the control circuit 540 on the low-voltage side, and supplies the generated gate signals to the switching elements $M_{11}$ and $M_{12}$.

As described above, according to the present embodiment, it is possible to detect the current $I_D$ flowing from the terminal $T_D$ on the high-voltage side and feed the signal indicating the voltage corresponding to the detected current $I_D$ back to the control circuit on the low-voltage side with a high SN ratio. Accordingly, the control circuit can enhance the accuracy in the feedback control of the switching elements $M_{11}$ and $M_{12}$. This makes it possible to reduce the loss due to the switching of the switching elements $M_{11}$ and $M_{12}$, and improve the conversion efficiency of the entire power converter.

Although the present embodiment illustrates some examples of performing measurement through insulation and signal transmission through insulation as application examples, the applications of the present invention are not limited to the present examples, and can be generally applied to analog signal processing. For example, a circuit similar to that in FIG. 15 can be used for applications such as cancelling the DC offset.

While certain embodiment have been described, these embodiment have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The embodiments as described before may be configured as below.

(Clauses)

Clause 1. An electronic circuitry comprising:
   a clock generation circuit configured to generate a first clock signal;
   a first conversion circuit configured to convert an input signal into a first signal having a frequency corresponding to the first clock signal based on the first clock signal;
   a first electromagnetic field coupler configured to transmit the first signal by electromagnetic field coupling;
   a second electromagnetic field coupler configured to transmit the first clock signal by electromagnetic field coupling; and
   a second conversion circuit configured to convert the first signal transmitted by the first electromagnetic field coupler into a second signal having a frequency corresponding to the input signal, based on the first clock signal transmitted by the second electromagnetic field coupler.

Clause 2. The electronic circuitry according to claim 1, comprising
   a phase adjustment circuit configured to adjust a phase of the first clock signal transmitted by the second electromagnetic field coupler to generate a second clock signal,
   wherein the second conversion circuit converts a frequency of the first signal based on the second clock signal to generate the second signal.

Clause 3. The electronic circuitry according to claim 2, comprising
   a waveform shaping circuit configured to shape a waveform of the first clock signal transmitted by the second electromagnetic field coupler,
   wherein the phase adjustment circuit adjusts the phase of the first clock signal based on the first clock signal of which the waveform is shaped, and
   a phase adjustment amount of the first clock signal in the phase adjustment circuit is based on a phase delay amount of the first clock signal generated in the waveform shaping circuit.

Clause 4. The electronic circuitry according to claim 3, wherein the waveform shaping circuit shapes the waveform of the first clock signal by amplifying the first clock signal.

Clause 5. The electronic circuitry according to claim 3, wherein the waveform shaping circuit shapes the waveform of the first clock signal by clipping the first clock signal.

Clause 6. The electronic circuitry according to any one of claims 2 to 5, comprising:
   a third conversion circuit configured to convert the first clock signal transmitted by the second electromagnetic field coupler into a first DC voltage signal corresponding to an amplitude of the first clock signal, based on the second clock signal; and
   a control circuit configured to determine a phase adjustment amount for adjustment by the phase adjustment circuit, based on a voltage of the first DC voltage signal, wherein the phase adjustment circuit adjusts the phase of the first clock signal by the phase adjustment amount determined by the control circuit.

Clause 7. The electronic circuitry according to claim 6, wherein the control circuit causes the phase adjustment circuit to perform phase adjustment with a plurality of phase adjustment amount candidates to acquire the voltage of the first DC voltage signal for each of the candidates, and determines a phase adjustment amount for adjustment by the phase adjustment circuit from the plurality of phase adjustment amount candidates, based on the voltage acquired for each of the candidates.

Clause 8. The electronic circuitry according to claim 7, wherein the control circuit determines a phase adjustment amount of one of the candidates by which a maximum voltage is obtained as a phase adjustment amount for adjustment by the phase adjustment circuit.

Clause 9. The electronic circuitry according to any one of claims 2 to 8, further comprising
   a fourth conversion circuit configured to convert a first reference voltage signal having a first reference voltage into a pulsed third signal having a frequency corresponding to the first clock signal, based on the first clock signal generated by the clock generation circuit,
   wherein the second electromagnetic field coupler transmits the third signal by the electromagnetic field coupling,
   the electronic circuitry further comprises a fifth conversion circuit configured to convert the third signal transmitted by the second electromagnetic field coupler based on the second clock signal into a second DC voltage signal according to an amplitude of the third signal, and
   a control circuit configured to determine a phase adjustment amount for adjustment by the phase adjustment circuit, based on a voltage of the second DC voltage signal, and
   the phase adjustment circuit adjusts the phase of the first clock signal by the phase adjustment amount determined by the control circuit.

Clause 10. The electronic circuitry according to claim 9, wherein the second conversion circuit includes a frequency converter configured to convert the first signal transmitted by the first electromagnetic field coupler into a fifth signal having a frequency corresponding to the input signal, based on the second clock signal, and a first amplifier configured to amplify the fifth signal, the second signal is a signal based on the fifth signal amplified by the first amplifier,
   the fifth conversion circuit includes a frequency converter configured to convert the third signal into a non-pulsed fourth signal based on the second clock signal, a second amplifier configured to amplify the fourth signal, and a low pass filter configured to reduce high-frequency components from the amplified fourth signal to obtain the second DC voltage signal, and
   the electronic circuitry further comprises a control circuit configured to control gains of the first amplifier and the second amplifier based on a comparison between a voltage of the second DC voltage signal and a second reference voltage.

Clause 11. The electronic circuitry according to claim 10, wherein the second conversion circuit further includes a low pass filter configured to reduce high-frequency components from the fifth signal amplified by the first amplifier to acquire the second DC voltage signal.

Clause 12. The electronic circuitry according to any one of claims 2 to 11, further comprising
a fourth conversion circuit configured to convert a first reference voltage signal having a first reference voltage into a pulsed third signal having a frequency corresponding to the first clock signal, based on the first clock signal generated by the clock generation circuit,
wherein the second electromagnetic field coupler transmits the third signal by the electromagnetic field coupling,
the electronic circuitry further comprises a fifth conversion circuit configured to convert the third signal transmitted by the second electromagnetic field coupler into a second DC voltage signal corresponding to an amplitude of the third signal, based on the second clock signal,
the second conversion circuit includes a frequency converter configured to convert the first signal transmitted by the first electromagnetic field coupler into a fifth signal having a frequency corresponding to the input signal, based on the second clock signal, and a first amplifier configured to amplify the fifth signal, and the second signal is a signal based on the fifth signal amplified by the first amplifier,
the fifth conversion circuit includes a frequency converter configured to convert the third signal into a non-pulsed fourth signal based on the second clock signal, a second amplifier configured to amplify the fourth signal, and a low pass filter configured to reduce high-frequency components from the amplified fourth signal to obtain the second DC voltage signal, and
the electronic circuitry further comprises a control circuit configured to control gains of the first amplifier and the second amplifier based on a comparison between a voltage of the second DC voltage signal and a second reference voltage.

Clause 13. The electronic circuitry according to claim 12, wherein the second conversion circuit includes a low pass filter configured to reduce high-frequency components from the fifth signal amplified by the first amplifier to acquire the second DC voltage signal.

Clause 14. The electronic circuitry according to any one of claims 1 to 13, comprising
a second phase adjustment circuit configured to adjust a phase of the first signal transmitted by the first electromagnetic field coupler to generate a sixth signal,
wherein the second conversion circuit converts a frequency of the sixth signal based on the first clock signal to generate the second signal.

Clause 15. The electronic circuitry according to any one of claims 3 to 14,
wherein a phase delay amount in the first electromagnetic field coupler is substantially same as a phase delay amount in the second electromagnetic field coupler.

Clause 16. The electronic circuitry according to any one of claims 1 to 15,
wherein the first electromagnetic field coupler includes at least one capacitor, and
the second electromagnetic field coupler includes at least one capacitor.

Clause 17. The electronic circuitry according to any one of claims 1 to 16,
wherein the first electromagnetic field coupler includes at least one transformer, and
the second electromagnetic field coupler includes at least one transformer.

Clause 18. A power converter that supplies electric power to a load device, comprising:
a first switching element having one end connected to the load device;
a second switching element having one end connected to the other end of the first switching element;
a detection circuit configured to detect an input signal that includes the voltage at the one end of the second switching element and the voltage of the other end of the second switching element;
a clock generation circuit configured to generate a first clock signal;
a first conversion circuit configured to convert the input signal into a first signal having a frequency corresponding to the first clock signal based on the first clock signal;
a first electromagnetic field coupler configured to transmit the first signal by electromagnetic field coupling;
a second electromagnetic field coupler configured to transmit the first clock signal by electromagnetic field coupling; and
a second conversion circuit configured to convert the first signal transmitted by the first electromagnetic field coupler into a second signal having a frequency corresponding to the input signal, based on the first clock signal transmitted by the second electromagnetic field coupler.

Clause 19. The power converter according to claim 18, further comprising
a control circuit configured to control ON and OFF timings of the first switching element and the second switching element, based on the second signal.

Clause 20. The power converter according to claim 19,
wherein the control circuit generates timing signals that indicate ON and OFF timings of the first switching element and the second switching element, and
the power converter further comprises a drive circuit configured to supply driving signals for driving the first switching element and the second switching element to control terminals of the first switching element and the second switching element, based on the timing signals.

The invention claimed is:
1. An electronic circuitry comprising:
a clock generation circuit configured to generate a first clock signal;
a first conversion circuit configured to convert an input signal into a first signal having a frequency corresponding to the first clock signal based on the first clock signal;
a first electromagnetic field coupler configured to transmit the first signal by electromagnetic field coupling;
a second electromagnetic field coupler configured to transmit the first clock signal by electromagnetic field coupling; and
a second conversion circuit configured to convert the first signal transmitted by the first electromagnetic field coupler into a second signal having a frequency corresponding to the input signal, based on the first clock signal transmitted by the second electromagnetic field coupler.

2. The electronic circuitry according to claim 1, comprising
a phase adjustment circuit configured to adjust a phase of the first clock signal transmitted by the second electromagnetic field coupler to generate a second clock signal,
wherein the second conversion circuit converts a frequency of the first signal based on the second clock signal to generate the second signal.

3. The electronic circuitry according to claim 2, comprising
a waveform shaping circuit configured to shape a waveform of the first clock signal transmitted by the second electromagnetic field coupler,
wherein the phase adjustment circuit adjusts the phase of the first clock signal based on the first clock signal of which the waveform is shaped, and
a phase adjustment amount of the first clock signal in the phase adjustment circuit is based on a phase delay amount of the first clock signal generated in the waveform shaping circuit.

4. The electronic circuitry according to claim 3,
wherein the waveform shaping circuit shapes the waveform of the first clock signal by amplifying the first clock signal.

5. The electronic circuitry according to claim 3,
wherein the waveform shaping circuit shapes the waveform of the first clock signal by clipping the first clock signal.

6. The electronic circuitry according to claim 3,
wherein a phase delay amount in the first electromagnetic field coupler is substantially same as a phase delay amount in the second electromagnetic field coupler.

7. The electronic circuitry according to claim 2, comprising:
a third conversion circuit configured to convert the first clock signal transmitted by the second electromagnetic field coupler into a first DC voltage signal corresponding to an amplitude of the first clock signal, based on the second clock signal; and
a control circuit configured to determine a phase adjustment amount for adjustment by the phase adjustment circuit, based on a voltage of the first DC voltage signal,
wherein the phase adjustment circuit adjusts the phase of the first clock signal by the phase adjustment amount determined by the control circuit.

8. The electronic circuitry according to claim 7,
wherein the control circuit causes the phase adjustment circuit to perform phase adjustment with a plurality of phase adjustment amount candidates to acquire the voltage of the first DC voltage signal for each of the candidates, and determines a phase adjustment amount for adjustment by the phase adjustment circuit from the plurality of phase adjustment amount candidates, based on the voltage acquired for each of the candidates.

9. The electronic circuitry according to claim 8, wherein the control circuit determines a phase adjustment amount of one of the candidates by which a maximum voltage is obtained as a phase adjustment amount for adjustment by the phase adjustment circuit.

10. The electronic circuitry according to claim 2, further comprising
a fourth conversion circuit configured to convert a first reference voltage signal having a first reference voltage into a pulsed third signal having a frequency corresponding to the first clock signal, based on the first clock signal generated by the clock generation circuit,
wherein the second electromagnetic field coupler transmits the third signal by the electromagnetic field coupling,
the electronic circuitry further comprises a fifth conversion circuit configured to convert the third signal transmitted by the second electromagnetic field coupler based on the second clock signal into a second DC voltage signal according to an amplitude of the third signal, and
a control circuit configured to determine a phase adjustment amount for adjustment by the phase adjustment circuit, based on a voltage of the second DC voltage signal, and
the phase adjustment circuit adjusts the phase of the first clock signal by the phase adjustment amount determined by the control circuit.

11. The electronic circuitry according to claim 10,
wherein the second conversion circuit includes a frequency converter configured to convert the first signal transmitted by the first electromagnetic field coupler into a fifth signal having a frequency corresponding to the input signal, based on the second clock signal, and a first amplifier configured to amplify the fifth signal, the second signal is a signal based on the fifth signal amplified by the first amplifier,
the fifth conversion circuit includes a frequency converter configured to convert the third signal into a non-pulsed fourth signal based on the second clock signal, a second amplifier configured to amplify the fourth signal, and a low pass filter configured to reduce high-frequency components from the amplified fourth signal to obtain the second DC voltage signal, and
the electronic circuitry further comprises a control circuit configured to control gains of the first amplifier and the second amplifier based on a comparison between a voltage of the second DC voltage signal and a second reference voltage.

12. The electronic circuitry according to claim 11,
wherein the second conversion circuit further includes a low pass filter configured to reduce high-frequency components from the fifth signal amplified by the first amplifier to acquire the second DC voltage signal.

13. The electronic circuitry according to claim 2, further comprising
a fourth conversion circuit configured to convert a first reference voltage signal having a first reference voltage into a pulsed third signal having a frequency corresponding to the first clock signal, based on the first clock signal generated by the clock generation circuit,
wherein the second electromagnetic field coupler transmits the third signal by the electromagnetic field coupling,
the electronic circuitry further comprises a fifth conversion circuit configured to convert the third signal transmitted by the second electromagnetic field coupler into a second DC voltage signal corresponding to an amplitude of the third signal, based on the second clock signal,
the second conversion circuit includes a frequency converter configured to convert the first signal transmitted by the first electromagnetic field coupler into a fifth signal having a frequency corresponding to the input signal, based on the second clock signal, and a first amplifier configured to amplify the fifth signal, and the second signal is a signal based on the fifth signal amplified by the first amplifier, the fifth conversion circuit includes a frequency converter configured to convert the third signal into a non-pulsed fourth signal based on the second clock signal, a second amplifier configured to amplify the fourth signal, and a low pass filter configured to reduce high-frequency components from the amplified fourth signal to obtain the second DC voltage signal, and the electronic circuitry further comprises a control circuit configured to control gains of the first amplifier and the second amplifier based on a comparison between a voltage of the second DC voltage signal and a second reference voltage.

14. The electronic circuitry according to claim 13, wherein the second conversion circuit includes a low pass filter configured to reduce high-frequency components from the fifth signal amplified by the first amplifier to acquire the second DC voltage signal.

15. The electronic circuitry according to claim 1, comprising a second phase adjustment circuit configured to adjust a phase of the first signal transmitted by the first electromagnetic field coupler to generate a sixth signal, wherein the second conversion circuit converts a frequency of the sixth signal based on the first clock signal to generate the second signal.

16. The electronic circuitry according to claim 1, wherein the first electromagnetic field coupler includes at least one capacitor, and the second electromagnetic field coupler includes at least one capacitor.

17. The electronic circuitry according to claim 1, wherein the first electromagnetic field coupler includes at least one transformer, and the second electromagnetic field coupler includes at least one transformer.

18. A power converter that supplies electric power to a load device, comprising:

a first switching element having one end connected to the load device;

a second switching element having one end connected to the other end of the first switching element;

a detection circuit configured to detect an input signal that includes the voltage at the one end of the second switching element and the voltage of the other end of the second switching element;

a clock generation circuit configured to generate a first clock signal;

a first conversion circuit configured to convert the input signal into a first signal having a frequency corresponding to the first clock signal based on the first clock signal;

a first electromagnetic field coupler configured to transmit the first signal by electromagnetic field coupling;

a second electromagnetic field coupler configured to transmit the first clock signal by electromagnetic field coupling; and a second conversion circuit configured to convert the first signal transmitted by the first electromagnetic field coupler into a second signal having a frequency corresponding to the input signal, based on the first clock signal transmitted by the second electromagnetic field coupler.

19. The power converter according to claim 18, further comprising a control circuit configured to control ON and OFF timings of the first switching element and the second switching element, based on the second signal.

20. The power converter according to claim 19, wherein the control circuit generates timing signals that indicate ON and OFF timings of the first switching element and the second switching element, and the power converter further comprises a drive circuit configured to supply driving signals for driving the first switching element and the second switching element to control terminals of the first switching element and the second switching element, based on the timing signals.

\* \* \* \* \*